(12) United States Patent  
Murakami

(10) Patent No.: US 6,930,333 B2
(45) Date of Patent: Aug. 16, 2005

(54) SEMICONDUCTOR DEVICE WIRING STRUCTURE

(75) Inventor: Yoshinori Murakami, Tokyo (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 10/883,973

(22) Filed: Jul. 6, 2004

(65) Prior Publication Data

US 2005/0012112 A1 Jan. 20, 2005

(30) Foreign Application Priority Data

Jul. 9, 2003 (JP) ........................................ 2003-272485

(51) Int. Cl.[7] .......................... H01L 29/74; H01L 23/48
(52) U.S. Cl. ...................... 257/150; 257/181; 257/659; 257/688
(58) Field of Search ................................ 257/150, 152, 257/177, 181, 182, 659, 660, 668, 688, 690

(56) References Cited

U.S. PATENT DOCUMENTS 5,463,249 A * 10/1995 Shinbo et al. ............. 257/690
5,821,618 A * 10/1998 Graf et al. .................. 257/723
6,060,774 A * 5/2000 Terui .......................... 257/692
6,417,527 B1 * 7/2002 Iwanaga et al. ............ 257/109
6,734,545 B1 * 5/2004 Yamamura .................. 257/691
2002/0153532 A1 * 10/2002 Sonobe et al. .............. 257/150

FOREIGN PATENT DOCUMENTS

JP         2003-164040         6/2003

* cited by examiner

Primary Examiner—T. N. Quach
(74) Attorney, Agent, or Firm—Shinjyu Global IP Counselors, LLP.

(57) ABSTRACT

A semiconductor device wiring structure is provided to reduce the wiring inductance and curtail the generation of interfering electromagnetic waves. A semiconductor chip having an anode electrode and a cathode electrode provided on two oppositely-facing main surfaces is sandwiched between a sheet-shaped anode wiring and a sheet-shaped cathode wiring. The anode and cathode electrodes of the semiconductor chip are connected to the anode and the cathode wirings, respectively, arranged such that the electric currents flowing there-through flow in opposite directions. A conductive substrate having a main surface with a larger width than the cathode wiring is disposed adjacent to the anode wiring. The edges of the cathode wiring protrude beyond the edges of both the anode wiring and the semiconductor chip in all locations and the dimension of the protrusion is at least one half of the distance from the edge of the cathode wiring to the metal substrate.

14 Claims, 20 Drawing Sheets 33  44

3  4

SEMICONDUCTOR DEVICE WIRING STRUCTURE

BACKGROUND OF THE INVENTION

1. Field of the Invention

The present invention relates to a wiring structure for a semiconductor device that is mounted to a substrate. More particularly, the present invention relates to a wiring structure for a semiconductor device for electric power applications.

2. Background Information

Japanese Laid-Open Patent Publication No. 2003-164040 discloses one of the conventional wiring structures for a semiconductor device. For example, in such a conventional wiring structure, a power device comprising a semiconductor chip is mounted to a substrate to form a module. A semiconductor chip constituting a power device is mounted to a metal substrate constituting a mounting substrate. An insulating layer is disposed between the semiconductor chip and the metal substrate. The metal substrate is, for example, a copper plate having a thickness of approximately 4 millimeters. The insulating layer is, for example, made of ceramic and connected to the metal substrate with solder.

An anode wiring (a collector wiring in this example) made of copper foil is formed such that the anode wiring adheres closely to the insulating layer. The semiconductor chip has a collector electrode on its rear surface and the anode wiring and the collector electrode of the semiconductor chip are connected and fixedly coupled together with solder. Similarly to the anode wiring, a copper foil cathode wiring (an emitter wiring in this example) is also formed such that the cathode wiring adheres closely to the insulating layer. The cathode wiring is electrically connected to an emitter pad formed on the semiconductor chip by an aluminum wire.

Main electrodes of the module are made of copper plates having a thickness of approximately 1 millimeter. The main electrode is connected to the anode wiring and the main electrode is connected to the cathode wiring. One end of each of the main electrodes is exposed to the outside of a plastic external shell of the module and has a screw hole provided therein. The screw holes of the main electrodes enable the main electrodes and to be connected to an external bus bar with screws.

In the conventional wiring structure explained above, the main wirings connected to the semiconductor device, i.e., the anode wiring and the cathode wiring, are separated by a distance. Consequently, there are cases in which the wiring inductance becomes large and the induced voltage restricts the drive conditions of the peripheral drive circuitry when the semiconductor chip executes high-speed switching operations. Moreover, each time a switching operation is executed in the conventional wiring structure explained above, electromagnetic waves are emitted from the main wirings and cause electromagnetic interference (EMI) in the peripheral drive circuitry. The possibility of this problem occurring is particularly high in small power supply units and IPMs (intelligent power modules) in which a drive circuit is provided integrally inside a module such as in the conventional wiring structure in order to achieve a compact wiring structure. Typically a shielding plate is provided in the vicinity of the drive circuit in order to avoid such interference, but this is not a fundamental solution to the problem.

In another example of a conventional wiring structure with a semiconductor chip mounted to a substrate, an anode wiring and a cathode wiring having a sheet-shape and approximately the same width are mounted to a metal substrate through an insulating layer. A semiconductor chip is mounted between the anode wiring and the cathode wiring such that a cathode electrode formed on the semiconductor chip with solder bumps is connected to the cathode wiring.

The anode wiring is connected to an anode wiring formed on the insulating layer and the cathode wiring is connected to a cathode wiring formed on the insulating layer. A control signal electrode formed on the semiconductor chip is connected to a control signal wiring pattern formed on the insulating layer through another control signal wiring pattern. The semiconductor chip is packaged in such a manner as to be enclosed inside the module external shell.

In this type of conventional wiring structure, the main electrodes, i.e., the anode wiring and the cathode wiring, are formed to extend in opposite directions with respect to the module. As a result, the distance between the anode wiring and the cathode wiring on the metal substrate is large and acts as a source of electromagnetic interference similarly to the situation depicted in the conventional wiring structure.

In view of the above, it will be apparent to those skilled in the art from this disclosure that there exists a need for an improved semiconductor device wiring structure that reduces the wiring inductance and suppresses the generation of interfering electromagnetic waves. This invention addresses this need in the art as well as other needs, which will become apparent to those skilled in the art from this disclosure.

SUMMARY OF THE INVENTION

It has been discovered that in a conventional semiconductor device wiring structure, particularly for an electric power semiconductor device, the main wirings are arranged in a flat planar manner on the substrate and the distance between the wirings tends to be large, resulting in a large wiring inductance. Consequently, when the voltage and current of the wirings undergoes a change, interfering electromagnetic waves are emitted to the surrounding space, which causes electromagnetic interference in the peripheral circuitry.

The present invention was conceived in view of this problem and one of the objects of the present invention is to provide a semiconductor device wiring structure that reduces the wiring inductance and suppresses the generation of interfering electromagnetic waves.

In order to achieve the above mentioned and other objects of the present invention, a semiconductor device wiring structure is provided that comprises a semiconductor device, a first sheet-shaped wiring, a second sheet-shaped wiring, and a conductive substrate. The semiconductor device has a first electrode on a first main surface and a second electrode on a second main surface that faces in an opposite direction as the first main surface. The first sheet-shaped wiring is connected to the first electrode of the semiconductor device. The second sheet-shaped wiring is connected to the second electrode of the semiconductor device, the second sheet-shaped wiring being disposed with respect to the first sheet-shaped wiring such that a current direction in the second sheet-shaped wiring is opposite to a current direction in the first sheet-shaped wiring. The conductive substrate has a main surface with a larger width than the second sheet-shaped wiring. The conductive substrate is arranged adjacent to the first sheet-shaped wiring such that the main surface of the conductive substrate is disposed substantially parallel to the first main surface of the semiconductor device. The second sheet-shaped wiring includes edges that protrude beyond corresponding edges of both of the first sheet-shaped wiring and the semiconductor device in all locations such that the second sheet-shaped wiring substantially covers the first sheet-shaped wiring and the semiconductor device in a top plan view. The edges of the second sheet-shaped wiring protrudes beyond the corresponding edges of at least one of the first sheet-shaped wiring and the semiconductor device by an amount that is at least one half of a distance from the edges of the second sheet-shaped wiring to the conductive substrate.

These and other objects, features, aspects and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 5($b$) is a diagram illustrating an electric potential distribution in a region surrounding the anode wiring and the cathode wiring of the semiconductor device wiring structure illustrated in FIGS. 1–4 in accordance with the first embodiment of the present invention;

FIG. 9($b$) is a simplified diagrammatic cross sectional view of a semiconductor device wiring structure taken along a section line 9($b$)—9($b$) of FIG. 9($a$) in accordance with the second embodiment of the present invention;

FIG. 14($b$) is a simplified diagrammatic cross section view of the semiconductor device wiring structure taken along the line 14($b$)—14($b$) of FIG. 14($a$) in accordance with the fifth embodiment of the present invention;

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Figure 1:
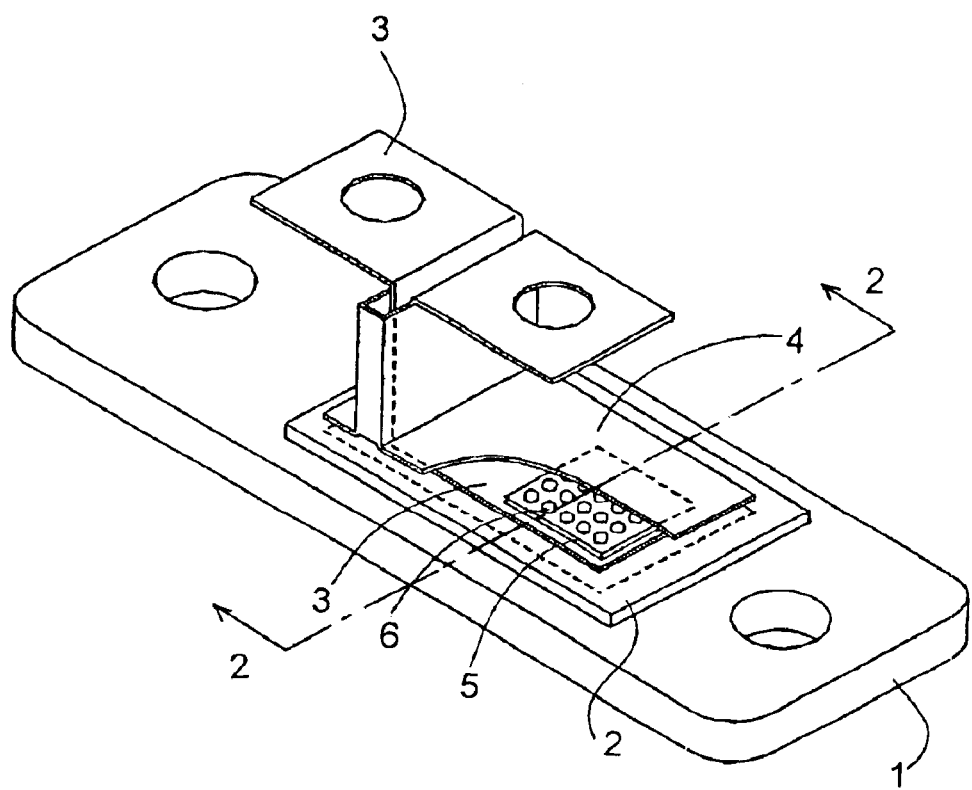
FIG. 1 is a simplified perspective view of a semiconductor device wiring structure in accordance with a first embodiment of the present invention.
Figure 2:
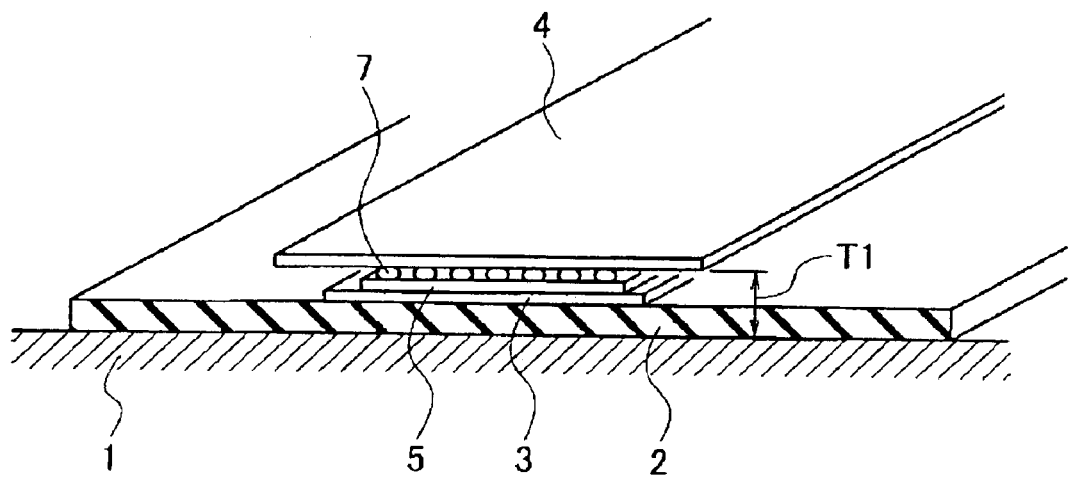
FIG. 2 is a simplified perspective cross sectional view of the semiconductor device wiring structure taken along a section line 2—2 in FIG. 1 in accordance with the first embodiment of the present invention.
Figure 3:
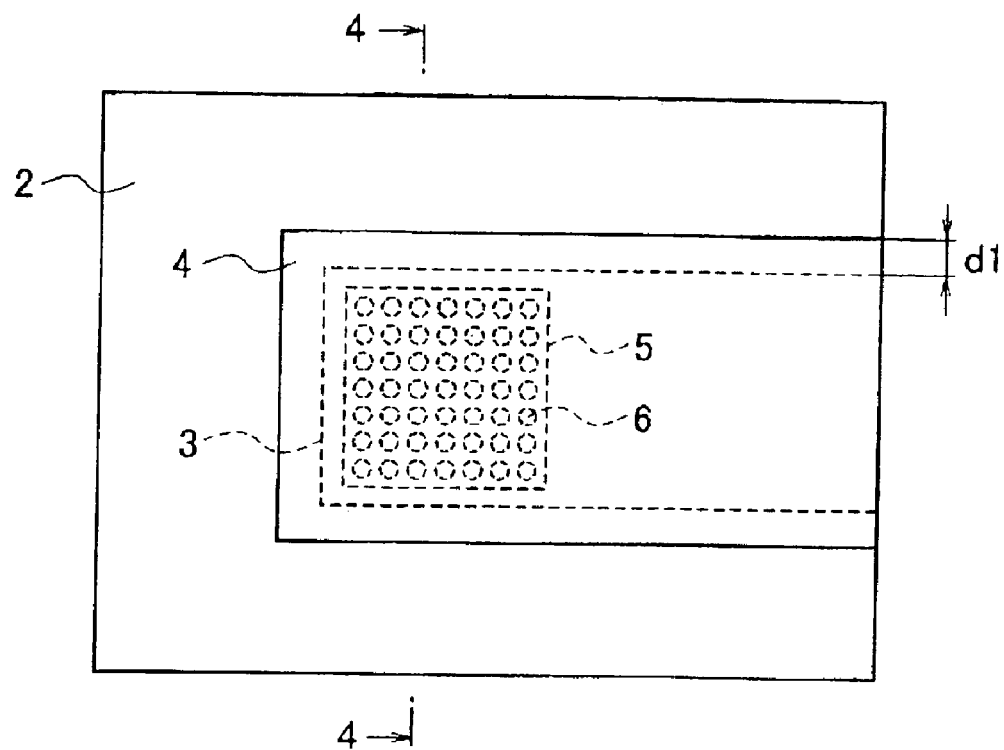
FIG. 3 is a top plan view of the semiconductor device wiring structure shown in FIGS. 1 and 2 in accordance with the first embodiment of the present invention.

Referring initially to FIGS. 1–6, a semiconductor device wiring structure is illustrated in accordance with a first embodiment of the present invention. FIG. 1 is a simplified perspective view of the semiconductor device wiring structure of the first embodiment. FIG. 2 is a simplified diagrammatic perspective view of a vertical cross section taken along a section line 2—2 of FIG. 1. FIG. 3 is a top plan see-through view of the wiring structure shown in FIG. 1. For the sake of brevity, the constituent items connected to the wirings of the module of the semiconductor device wiring structure of the present invention are omitted in FIGS. 1–3.

As shown in FIG. 1, an insulating sheet 2 is formed on a metal (conductive) substrate 1 and a semiconductor device or semiconductor chip 5 is mounted to the metal substrate 1 such that the semiconductor chip 5 is sandwiched between a sheet-shaped anode wiring 3 and a sheet-shaped cathode wiring 4. The sheet-shaped anode wiring 3 and the sheet-shaped cathode wiring 4 are arranged face-to-face via the semiconductor chip 5 on the insulating sheet 2. The sheet-shaped anode wiring 3 and a sheet-shaped cathode wiring 4 preferably constitute a first sheet-shaped wiring and a second sheet-shaped wiring, respectively. The metal substrate 1 is arranged closely adjacent to the anode wiring 3 and has a main surface that is substantially parallel to the semiconductor chip 5. The main surface of the metal substrate 1 has a larger width than the cathode wiring 4 and the cross sectional area of the metal substrate is larger than that of the cathode wiring 4. The semiconductor chip 5 used in the first embodiment is preferably a device having two terminals, such as a diode chip. The semiconductor chip 5 with two terminals is a conventional component that is well known in the art. Since the semiconductor chip 5 is well known in the art, these structures will not be discussed or illustrated in detail herein.

More specifically, a cathode electrode 6 is preferably formed on the front surface of the semiconductor chip 5 and the cathode electrode 6 is preferably connected to the cathode wiring 4 through a plurality of solder bumps 7 formed on the cathode electrode 6. An anode electrode is formed on the rear surface of the semiconductor chip 5 and the anode electrode is preferably connected to the anode wiring 3 with solder. Of course, it will be apparent to those skilled in the art from this disclosure that it is also acceptable to use an electrically conductive adhesive for the connection between the cathode wiring 4 and the cathode electrode 6 and/or the connection between the anode wiring 3 and the anode electrode. In the first embodiment of the present invention, the rear surface and the front surface of the semiconductor chip 5 preferably constitute first and second main surfaces, respectively, and the anode electrode and the cathode electrode 6 preferably constitute first and second electrodes, respectively.

The anode wiring 3 and the cathode wiring 4 are preferably arranged such that the electric currents flowing therethrough flow in opposite directions. Additionally, the width of the cathode wiring 4 is arranged to be larger than the width of the anode wiring 3 such that the cathode wiring 4 protrudes beyond the anode wiring 3 in the lengthwise and widthwise directions to entirely cover the anode wiring 3 as seen in FIG. 1. More specifically, as seen in FIG. 3, each widthwise edges of the cathode wiring 4 preferably protrudes beyond the anode wiring 3 by a distance d1.

Figure 4:
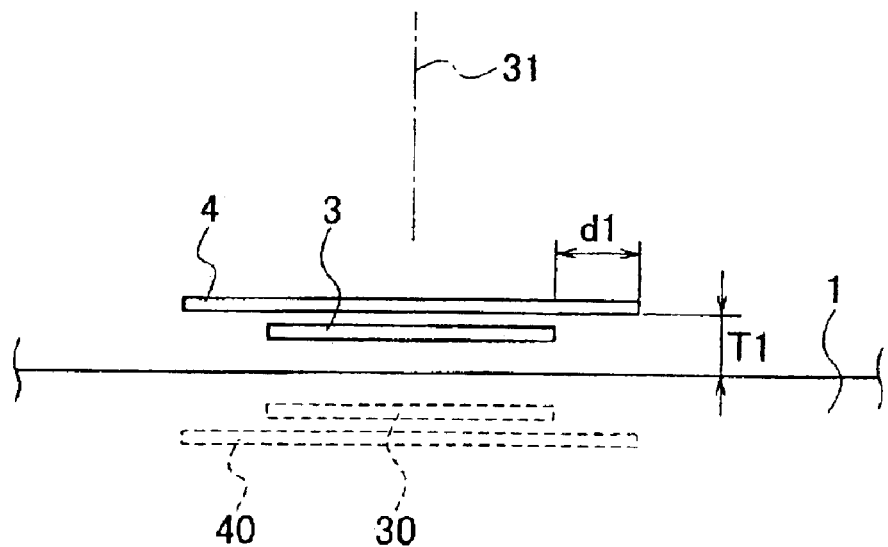
FIG. 4 is a simplified diagrammatic cross sectional view for illustrating dimensional relationships between an anode wiring, a cathode wiring and a metal substrate of the semiconductor device wiring structure shown in FIGS. 1–3 taken along a section line 4—4 in FIG. 3 in accordance with the first embodiment of the present invention.

FIG. 4 is a simplified diagrammatic cross sectional view for illustrating dimensional relationships between the anode wiring 3, the cathode wiring 4 and the metal substrate 1 taken along a section line 4—4 in FIG. 3. FIG. 4 basically shows the same cross sectional view as in FIG. 2, but in FIG. 4 the insulating sheet 2 and the semiconductor chip 5 are omitted for the sake of illustration. As seen in FIG. 4, the cathode wiring 4 and the metal substrate 1 are preferably arranged such that a distance T1 is formed between the cathode wiring 4 and the main surface of the metal substrate. Moreover, in FIG. 4, a mirror image 30 of the anode wiring 3 with respect to the metal substrate 1 and a mirror image 40 of the cathode wiring 4 with respect to the metal substrate 1 are indicated with broken lines. At the moment when the voltage on the cathode wiring 4 is +V and the voltage on the anode wiring 3 is −V, the electric lines of force develop around the metal substrate 1 as if the voltage at the mirror image 30 is −V and the voltage at the mirror image 40 is +V due to the existence of the metal substrate 1.

Figure 5A:
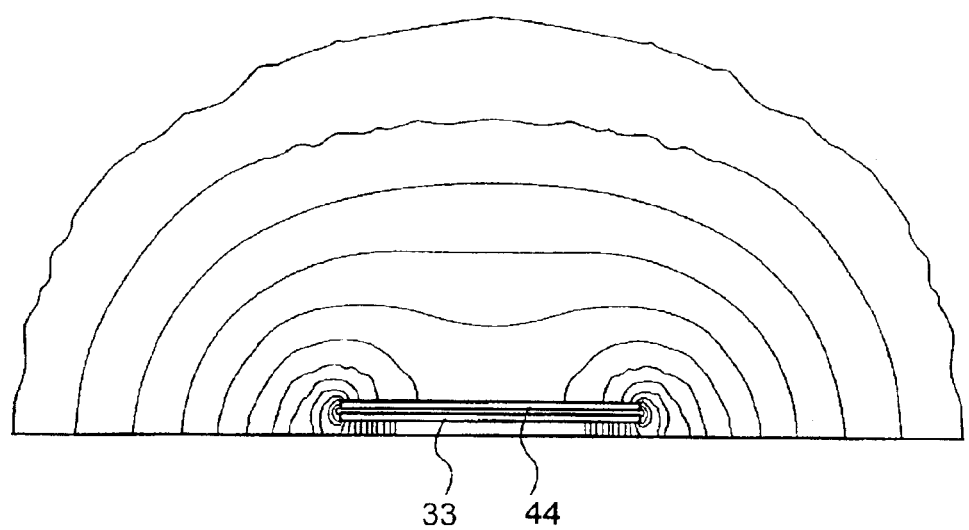
FIG. 5($a$) is a diagram illustrating an electric potential distribution in a region surrounding an anode wiring and a cathode wiring when widths of the anode wiring and the cathode wiring are substantially the same.
Figure 5B:
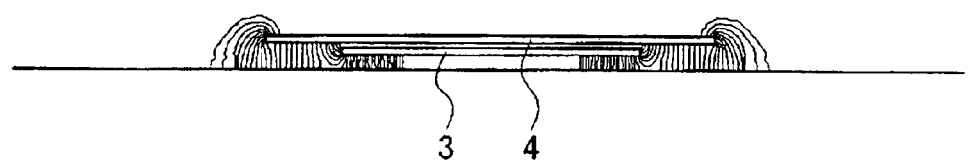

FIGS. 5($a$) and 5($b$) show simplified spacial distributions of the electric potential of the electric lines of force as obtained using simulations. FIG. 5($a$) illustrates an example of a case in which an anode wiring 33 and a cathode wiring 44 have approximately the same width as in the conventional wiring structure. On the other hand, FIG. 5($b$) illustrates a simplified spacial distribution of the electric potential of the electric lines of force in accordance with the first embodiment of the present invention in which the cathode wiring 4 protrudes beyond the anode wiring 3. In FIGS. 5($a$) and 5($b$), it is assumed that the size of the semiconductor chip 5 that is to be sandwiched between the cathode wiring 44 and the anode wiring 33 or the cathode wiring 4 and the anode wiring 3 is approximately 10 mm square, the minimum width of the cathode wirings 44 or 4 and the anode wirings 33 or 3 is approximately 12 mm, the thickness of the cathode wirings 44 or 4 and the anode wirings 33 or 3 is approximately 0.3 mm, and distance from the metal substrate 1 to the anode wiring 33 or 3 is approximately 0.6 mm. Also, an interval between two adjacent lines of equal electric potential is the same in FIGS. 5($a$) and 5($b$).

As seen in FIG. 5($a$), a considerable electric potential distribution exists around the anode wiring 33 and the cathode wiring 44 in the conventional semiconductor device wiring structure. In other words, when the electric potential between the anode wiring 33 and the cathode wiring 44 changes abruptly, considerably strong interfering electromagnetic waves are generated with a similar degree of spread to that shown in FIG. 5($a$).

On the other hand, in the present invention as shown in FIG. 5($b$), by arranging the closely adjacent metal substrate 1 such that the metal substrate has a resistance that is low enough to assume the mirror images of the anode wiring 3 and the cathode wiring 4 exist, the protrusion of the cathode wiring 4 beyond the anode wiring 3 greatly curtails the electric potential distribution around the wiring patterns. As a result, the emission of electromagnetic waves to the region surrounding the anode wiring 3 and the cathode wiring 4 can be greatly curtailed as seen in FIG. 5($b$).

Figure 6:
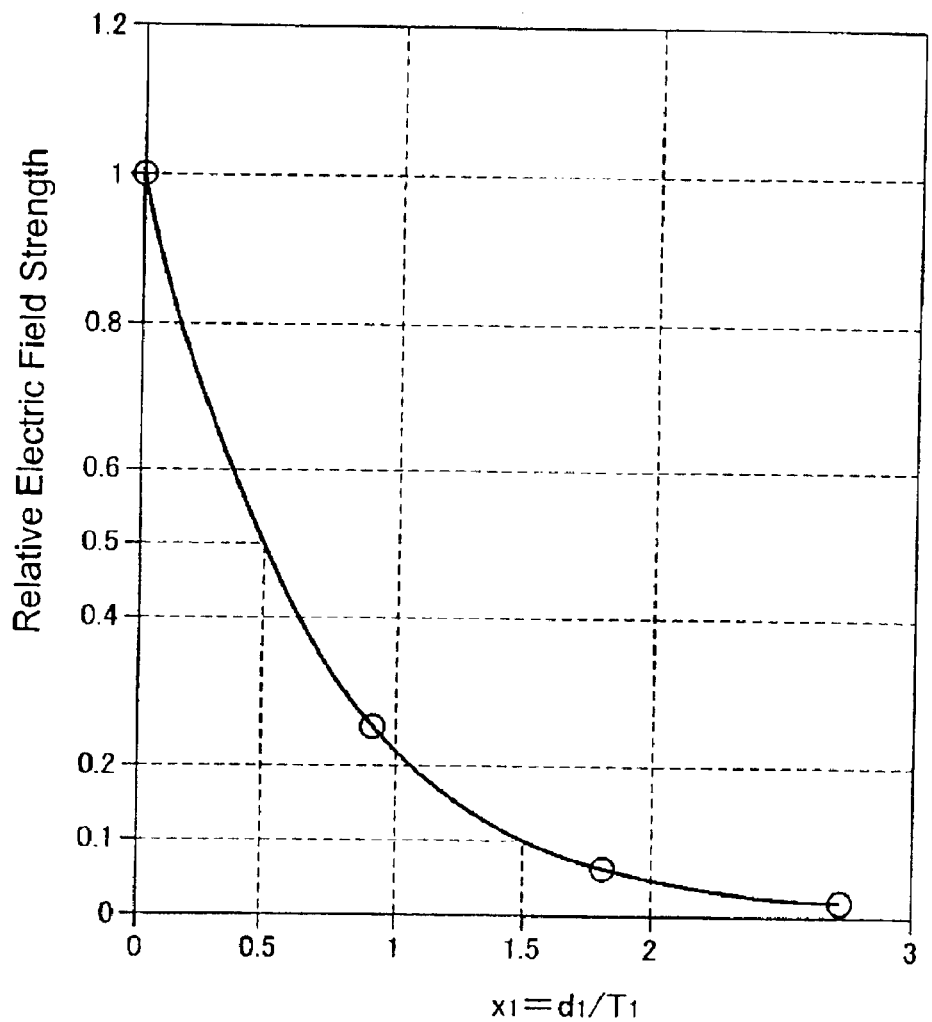
FIG. 6 is a graph plotting a relative electric field strength versus a parameter x1 for the semiconductor device wiring structure illustrated in FIGS. 1–4 in accordance with the first embodiment of the present invention to illustrate the dependence of the electric field strength surrounding the cathode wiring relative to the parameter d1/T1.

FIG. 6 shows results of simulations of the relative electric field strength above a center portion of the anode wiring 3 and the cathode wiring 4 shown in FIG. 4 (i.e., the portion indicated by the single-dot dash line 31 in FIG. 4). The plot shown in FIG. 6 is based on a parameter x1=d1/T1, where d1 is a dimension of the protrusion of the edge of the cathode wiring 4 beyond the edge of the anode wiring 3 as shown in FIGS. 3 and 4, and T1 is the distance from the cathode wiring 4 to the main surface of the metal substrate 1 as shown in FIGS. 2 and 4.

As shown in FIG. 6, the relative electric field strength corresponding to $x1=0.5$ is one half the relative electric field strength corresponding to $x1=0$, i.e., the conventional structure shown in FIG. 5($a$), which indicates that an electromagnetic wave suppressing effect is exhibited. Furthermore, the relative electric field strength corresponding to $x1=1.5$ is approximately one tenth of the relative electric field strength corresponding to $x1=0$. Moreover, the relative electric field strength corresponding to $x1=3$ is approximately one hundredth of the relative electric field strength corresponding to $x1=0$. The example shown in FIG. 5($b$) corresponds to approximately $x1=1.8$.

Accordingly, with the semiconductor device wiring structure of the present invention, the wiring inductance is reduced and the emission of interfering electromagnetic waves is suppressed.

Moreover, although the cross sectional shape of the cathode wiring 4 of the first embodiment shown in FIG. 2 is arranged as a flat plate, the cross sectional shape of the cathode wiring 4 is not limited to the flat shape so long as the distance T1 from the end part of the cathode wiring 4 to the metal substrate 1 is substantially the same.

Figure 7:
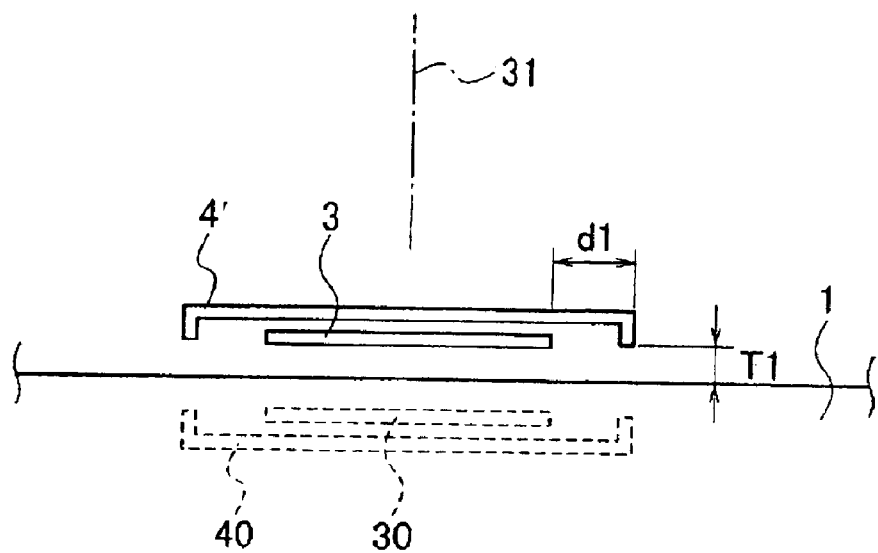
FIG. 7 is a simplified diagrammatic cross sectional view of a semiconductor device wiring structure in accordance with an alternative of the first embodiment of the present invention.
Figure 8:
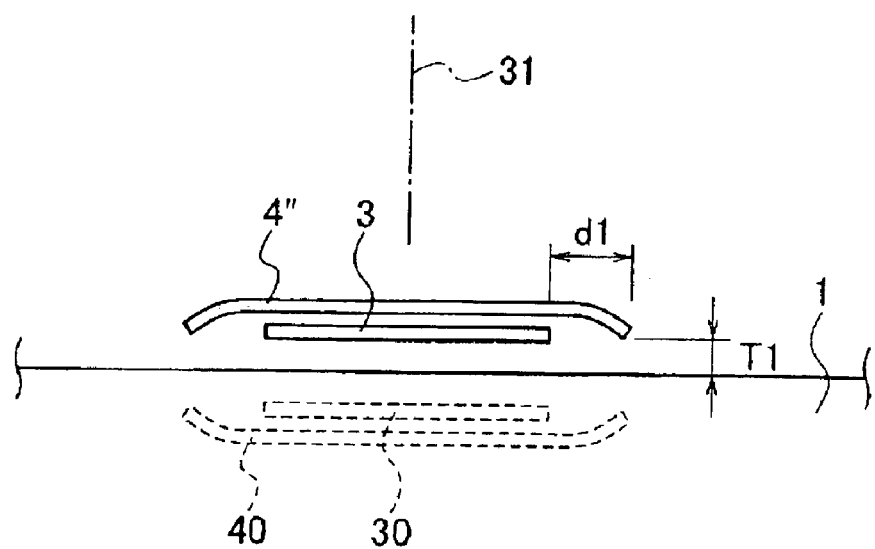
FIG. 8 is a simplified diagrammatic cross sectional view of a semiconductor device wiring structure in accordance with an alternative of the first embodiment of the present invention.

For example, FIG. 7 shows an alternative semiconductor device wiring structure of the first embodiment in which both end parts of a cathode wiring 4' are bent at right angles toward the metal substrate 1. Additionally, FIG. 8 shows another alternative of the semiconductor device wiring structure of the first embodiment in which both end parts of a cathode wiring 4" are curved toward the metal substrate 1. Either of these shapes of the cathode wiring 4' or 4" have substantially same effects as the semiconductor device wiring structure in accordance with the first embodiment of the present invention.

Second Embodiment

Figure 9A:
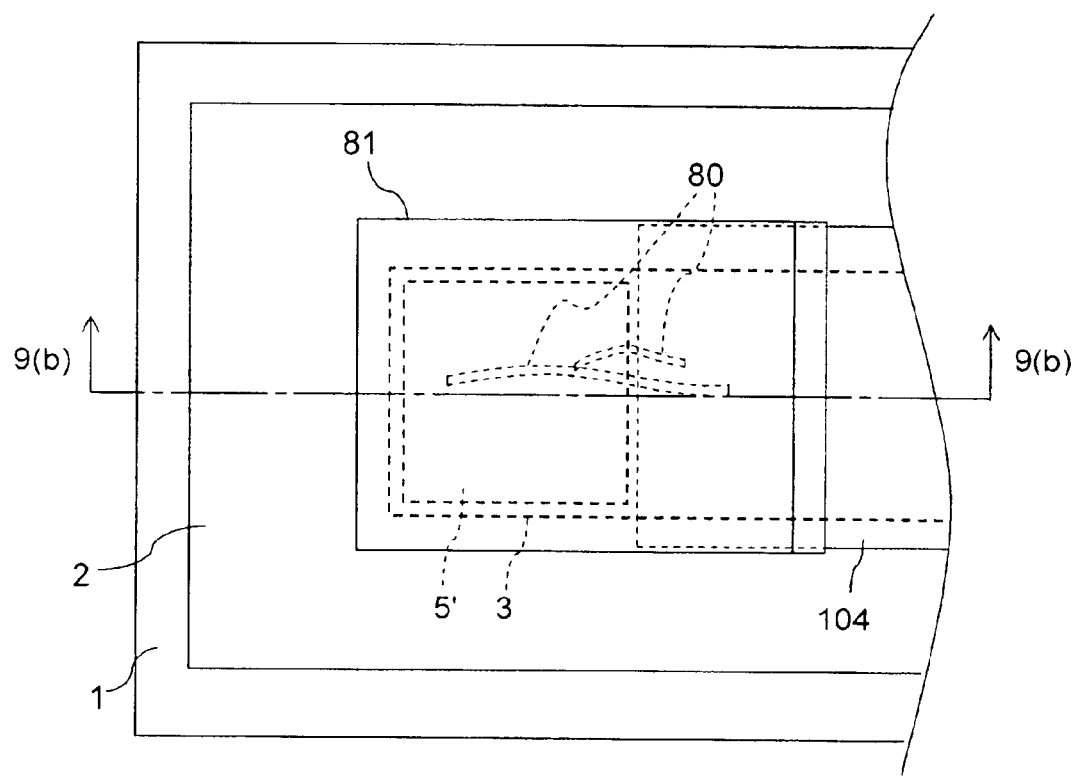
FIG. 9($a$) is a top plan view of a semiconductor device wiring structure in accordance with a second embodiment of the present invention.
Figure 9B:
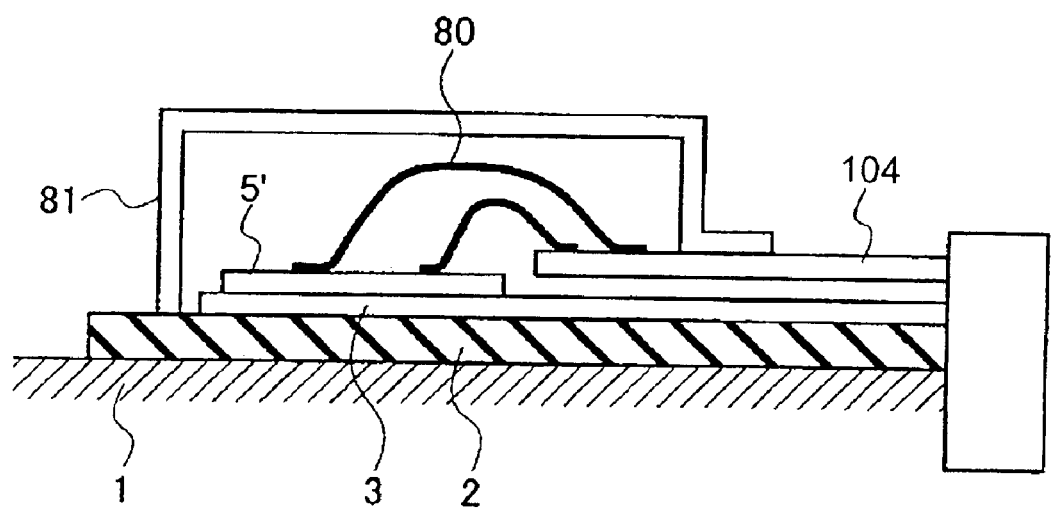

Referring now to FIGS. 9($a$) and 9($b$), a semiconductor device wiring structure in accordance with a second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

FIG. 9($a$) is a simplified diagrammatic cross sectional view of a semiconductor device wiring structure in accordance with the second embodiment of the present invention. The cross section shown in FIG. 9($b$) is taken along line 9($b$)—9($b$) of FIG. 9($a$) and viewed from the direction of the arrows adjacent to the same line. Basically, the semiconductor device wiring structure of the second embodiment shown in FIGS. 9($a$) and 9($b$) is identical to the alternative of the first embodiment shown in FIG. 7, except that the shape of a cathode wiring 104 has been modified from the cathode wiring 4 of the first embodiment. Moreover, the cathode wiring 104 is preferably connected to the cathode electrode formed on the front surface (second main surface) of a semiconductor chip 5' with a bonding wire 80, which is relatively easy to connect. Also, a box-shaped second cathode wiring 81 is preferably connected to the cathode wiring 104 in such a manner that the second cathode wiring 81 substantially covers the semiconductor chip 5. In the second embodiment of the present invention, the cathode wiring 104 and the second cathode wiring 81 preferably together constitute a first sheet-like wiring.

Accordingly, the semiconductor device wiring structure of the second embodiment provides a similar interfering electromagnetic wave suppressing effect to that obtained with the first embodiment of the present invention. Additionally, since the semiconductor chip 5 and the cathode wiring 4 are connected using wire bonding, the semiconductor device wiring structure of the second embodiment has a high resistance to stresses resulting from temperature changes. Moreover, the semiconductor chip 5 can be mounted to the semiconductor device wiring structure more easily.

Third Embodiment

Figure 10:
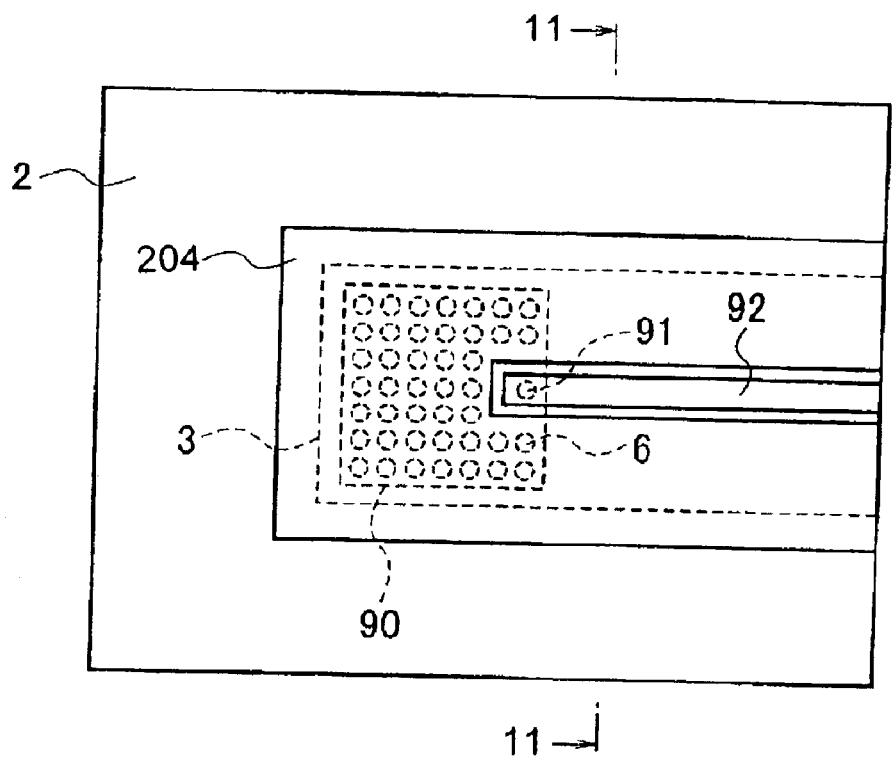
FIG. 10 is a top plan view of a semiconductor device wiring structure in accordance with a third embodiment of the present invention.
Figure 11:
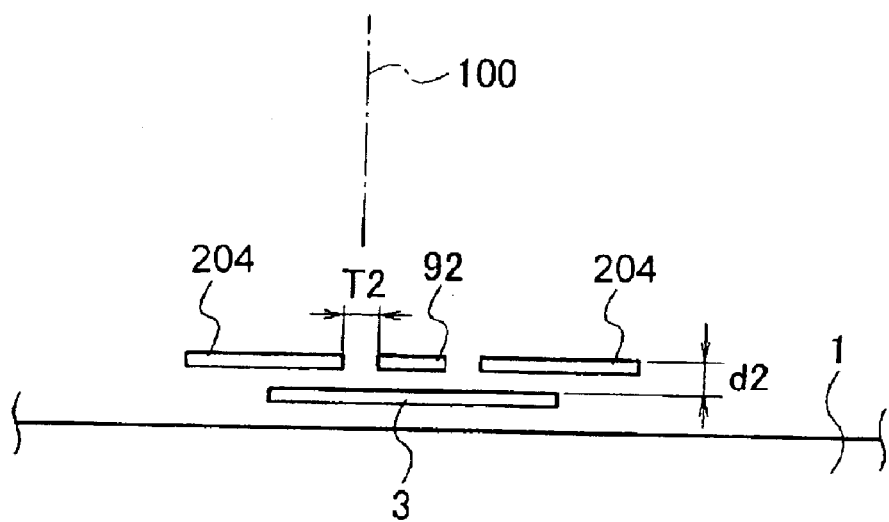
FIG. 11 is a simplified diagrammatic cross section view of the semiconductor device wiring structure taken along the line 11—11 of FIG. 10 in accordance with the third embodiment of the present invention.
Figure 12:
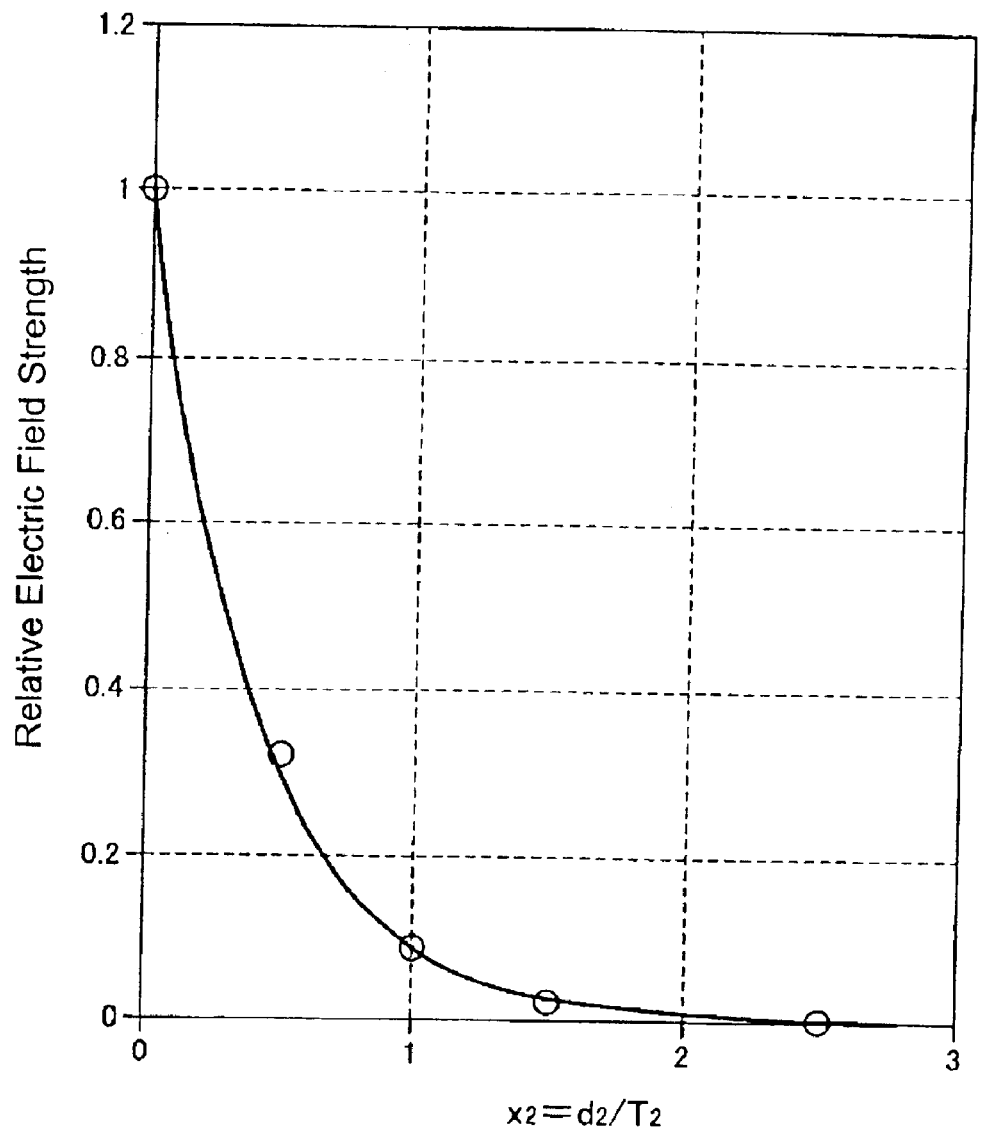
FIG. 12 is a graph plotting a relative electric field strength versus a parameter x2 for the semiconductor device wiring structure illustrated in FIGS. 10 and 11 in accordance with the third embodiment of the present invention.

Referring now to FIGS. 10–12, a semiconductor device wiring structure in accordance with a third embodiment will now be explained. In view of the similarity between the first, second and third embodiments, the parts of the third embodiment that are identical to the parts of the first or second embodiment will be given the same reference numerals as the parts of the first or second embodiment. Moreover, the descriptions of the parts of the third embodiment that are identical to the parts of the first or second embodiment may be omitted for the sake of brevity.

FIG. 10 is a top plan see-through view of the semiconductor device wiring structure in accordance with the third embodiment of the present invention. In the third embodiment of the present invention, a semiconductor chip 90 having three terminals, such as a transistor, is used as a semiconductor device as seen in FIG. 10. FIG. 11 is a simplified diagrammatic cross sectional view taken along the section line 11—11 of FIG. 10. Basically, the third embodiment of the present invention differs from the first embodiment shown in FIGS. 1–3 in that the semiconductor chip 90 in the third embodiment is a three-terminal device having a control signal electrode 91, and the semiconductor device wiring structure of the third embodiment includes a control signal wiring 92 that is connected to the control signal electrode 91 of the semiconductor chip 90. Moreover, a cathode wiring 204 is arranged to include a cut away portion to accommodate the control signal wiring 92. The semiconductor chip 90 with three terminals is a conventional component that is well known in the art. Since the semiconductor chip 90 is well known in the art, these structures will not be discussed or illustrated in detail herein.

More specifically, as shown in FIG. 10, the control signal wiring 92 is preferably arranged inside a cut away portion formed in the approximate widthwise-middle portion of the sheet-shaped cathode wiring 204. By arranging the control signal wiring 92 as explained above, the wiring inductance between the cathode wiring 204 and the control signal wiring 92 can be reduced and the interfering electric waves can be suppressed in comparison with the conventional wiring structure in which the control signal wiring is arranged on one side of the module.

Furthermore, as shown in FIG. 11, the narrower a width T2 of a gap between the cathode wiring 204 and the control signal wiring 92 is, the greater the degree to which interfering electromagnetic waves resulting from changes in the voltage and current between the anode wiring 3 and the cathode wiring 204 are suppressed. FIG. 12 shows a plot of the relative electric field strength at an arbitrary point above the center of the gap between the cathode wiring 204 and the control signal wiring 92 (i.e., the portion indicated by the single-dot dash line 100 in FIG. 11) versus a parameter $x2=d2/T2$, where d2 is a distance from the front surface of the cathode wiring 204 to the anode wiring 3, as shown in FIG. 11. Similarly to the plot shown in FIG. 6, the plot shown in FIG. 12 was obtained from simulations.

In a case where the potential difference of the anode wiring 3 with respect to the cathode wiring 204 is so large that the potential difference between the cathode wiring 204 and the control signal wiring 92 can almost be ignored, narrowing the gap width T2 curtails the strength of the electromagnetic waves leaking from the gap between the cathode wiring 204 and the control signal wiring 92 markedly as indicated in FIG. 12.

Also, in FIG. 12, the relative electric field strength at x2=0 corresponds to a case in which the gap width T2 is large or a case in which the anode wiring 3 is bulged upward such that a top surface of the anode wiring 3 is at the same height as the top surface of the cathode wiring 204. In other words, the relative electric field strength at x2=0 corresponds to a case in which the anode wiring 3 and the cathode wiring 204 are arranged substantially on a same plane, as in the conventional semiconductor device wiring structure. Thus, as seen in FIG. 12, the relative electric field strength can be markedly reduced in the present invention with respect to the conventional wiring structure. For example, when d2 is approximately 1 millimeter and T2 is approximately 4 millimeters or less, the relative electric field strength is reduced by one half or more.

Fourth Embodiment

Figure 13:
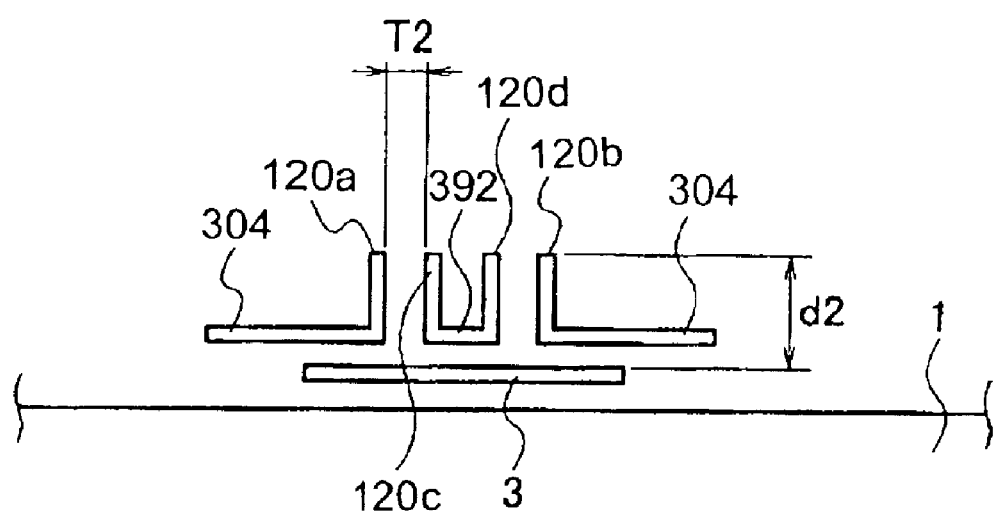
FIG. 13 is a simplified diagrammatic cross sectional view of a semiconductor device wiring structure in accordance with a fourth embodiment of the present invention.

Referring now to FIG. 13, a semiconductor device wiring structure in accordance with a fourth embodiment will now be explained. In view of the similarity between the third and fourth embodiments, the parts of the fourth embodiment that are identical to the parts of the third embodiment will be given the same reference numerals as the parts of the third embodiment. Moreover, the descriptions of the parts of the fourth embodiment that are identical to the parts of the third embodiment may be omitted for the sake of brevity.

FIG. 13 is a simplified diagrammatic cross sectional view of the semiconductor device wiring structure in accordance with the fourth embodiment of the present invention similar to the cross sectional view shown in FIG. 11 of the third embodiment. The fourth embodiment of the present invention is basically identical to the third embodiment, except that a plurality of brims 120a–120d are provided on the edges of the cathode wiring 304 and the control signal wiring 392 at the gap portions between the cathode wiring 304 and the control signal wiring 392 as seen in FIG. 13. The brims 120a–120d are arranged to extend at perpendicularly from the edges of the cathode wiring 304 and the control signal wiring 392 in the opposite direction of the anode wiring 3 (i.e., in the upward direction in FIG. 13). The brims 120a–120d are preferably configured to form a distance T2 between a terminal point (first terminal point) of the cathode wiring 304 that is located farthest from the anode wiring 3 that faces the control signal wiring 392 and a terminal point (second terminal point) of the control signal wiring 392 that is located farthest from the anode wiring 3 that faces the cathode wiring 304. Moreover, the brims 120a–120d are preferably configured such that the distance T2 is equal to or smaller than four times a distance d2 from at least one of the terminal points of the cathode wiring 304 and the control signal wiring 392 to the anode wiring 3 as seen in FIG. 13.

Accordingly, in the semiconductor device wiring structure of the fourth embodiment, the leakage of electromagnetic waves from the gaps between the cathode wiring 304 and the control signal wiring 392 can be further curtailed. Additionally, by providing brims 120a–120d on the edge parts of the cathode wiring 304 and the control signal wiring 392, the cross sectional area and the conductivity of the cathode wiring 304 and control signal wiring 392 both increase. Moreover, the mechanical strength of the cathode wiring 304 and control signal wiring 392 can be improved.

Fifth Embodiment

Figure 14A:
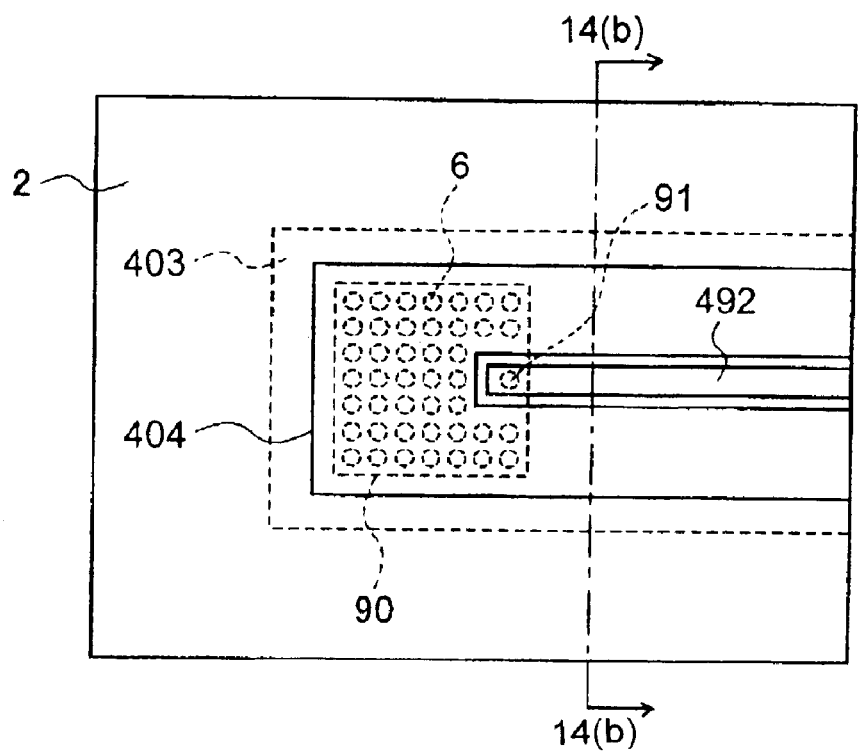
FIG. 14($a$) is a top plan view of a semiconductor device wiring structure in accordance with a fifth embodiment of the present invention.
Figure 14B:
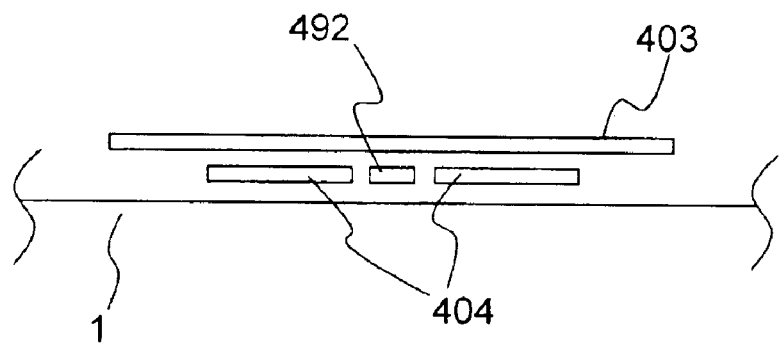

Referring now to FIGS. 14(a) and 14(b), a semiconductor device wiring structure in accordance with a fifth embodiment will now be explained. In view of the similarity between the third, fourth and fifth embodiments, the parts of the fifth embodiment that are identical to the parts of the third or fourth embodiment will be given the same reference numerals as the parts of the third or fourth embodiment. Moreover, the descriptions of the parts of the fifth embodiment that are identical to the parts of the third or fourth embodiment may be omitted for the sake of brevity.

In the third or fourth embodiment of the present invention explained above, a configuration was described in which the semiconductor chip 5 or 90 was mounted to the metal substrate 1 using a so-called face up bonding technique. The fifth embodiment of the present invention differs from the third or fourth embodiment in that the three-terminal semiconductor chip 90 is mounted using face down bonding as illustrated in FIG. 14(a). FIG. 14(a) is a see-through view similar to that of FIG. 10, except that the semiconductor chip 90 and an anode wiring 403 (which is placed on top) are omitted with their positions indicated with broken lines. FIG. 14(b) shows a simplified diagrammatic cross section view of the semiconductor device wiring structure as taken along a section line 14(b)—14(b) of FIG. 14(a). As seen in FIG. 14(b), in the fifth embodiment of the present invention, a cathode wiring 404 is preferably disposed between the anode wiring 403 and the metal substrate 1. Moreover, edges of the anode electrode 403 preferably protrude beyond corresponding edges of the cathode electrode 404 as seen in FIGS. 14(a) and 14(b). Also, the anode wiring 403 and the cathode wiring 404 are preferably arranged such that the edges of the anode wiring 403 protruding beyond the corresponding edges of the cathode wiring 404 by an amount that is at least one half of a distance from the edges of the anode wiring 403 to the metal substrate 1 as seen in FIG. 14(b). In the fifth embodiment, the cathode wiring 404 preferably constitutes a first sheet-shaped wiring, and the anode wiring 403 preferably constitutes a second sheet-shaped wiring.

Accordingly, in the fifth embodiment of the present invention, the semiconductor chip 90 is disposed such that the cathode electrode 6 and the control signal electrode 91 are provided at the bottom surface (first main surface). Therefore, the cathode electrode 6 and the control signal electrode 91 are connected to the cathode wiring 404 disposed underneath the semiconductor chip 90. A control signal wiring 492 is preferably connected to the control signal electrode 91. The control signal wiring 492 is disposed within a cut away portion formed in the cathode wiring 404 as see in FIGS. 14(a) and 14(b). Of course, it will be apparent to those skilled in the art from this disclosure that the face down bonding of the fifth embodiment can also be applied to the two-terminal semiconductor device shown in FIGS. 1–3 in the first embodiment.

Sixth Embodiment

Figure 15:
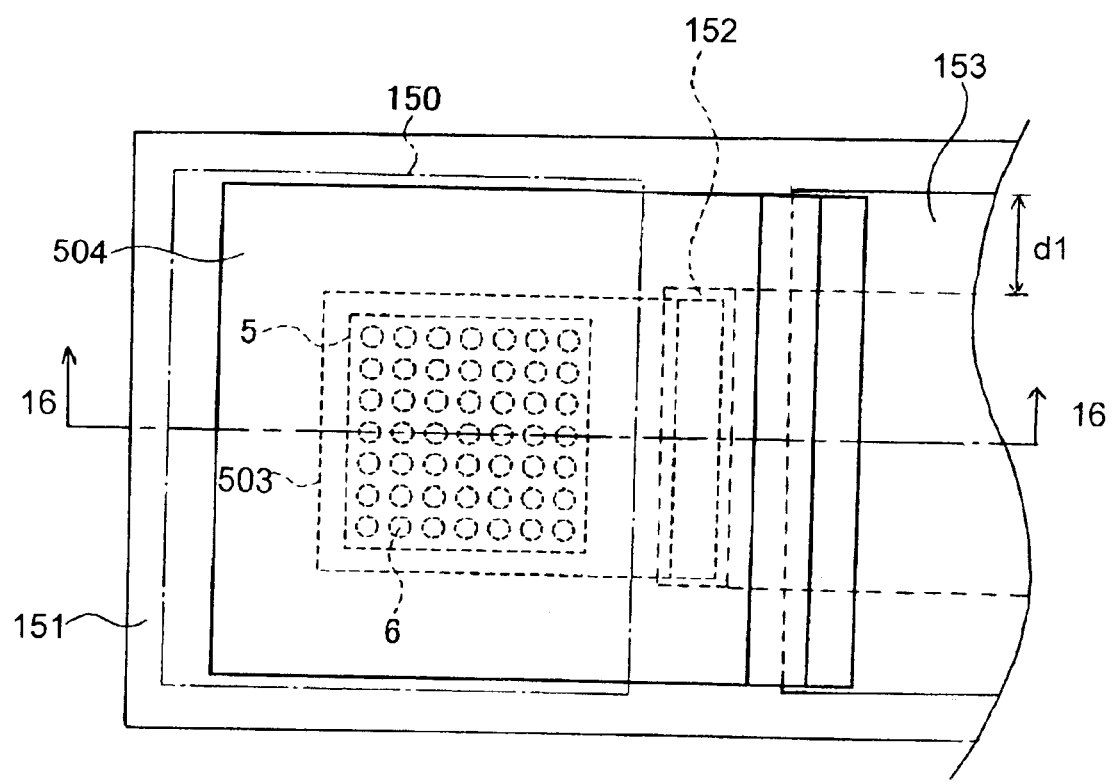
FIG. 15 is a top plan view of a semiconductor device wiring structure in accordance with a sixth embodiment of the present invention.
Figure 16:
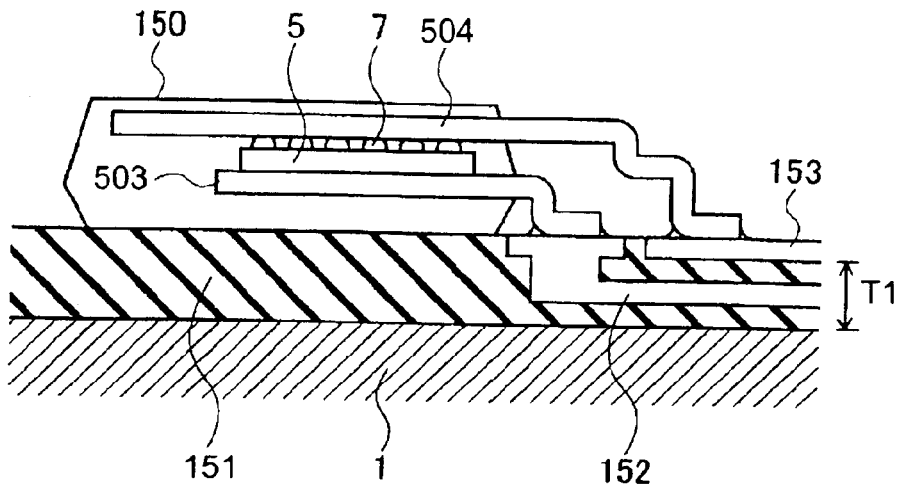
FIG. 16 is a simplified diagrammatic cross sectional view of the semiconductor device wiring structure taken along a section line 16—16 in FIG. 15 in accordance with the sixth embodiment of the present invention.

Referring now to FIGS. 15 and 16, a semiconductor device wiring structure in accordance with a sixth embodiment will now be explained. In view of the similarity between the first and sixth embodiments, the parts of the sixth embodiment that are identical to the parts of the first embodiment will be given the same reference numerals as the parts of the first embodiment. Moreover, the descriptions of the parts of the sixth embodiment that are identical to the parts of the first embodiment may be omitted for the sake of brevity.

FIG. 15 is a top plan see-through view of the semiconductor device wiring structure of the sixth embodiment while FIG. 16 is a simplified diagrammatic cross sectional view of the semiconductor device wiring structure taken along a section line 16—16 in FIG. 15. The sixth embodiment is an example of applying the present invention to a small, portable semiconductor chip module.

In FIGS. 15 and 16, the semiconductor chip 5 and an anode wiring 503 and a cathode wiring 504 connected to the semiconductor chip 5 are packaged so as to be completely enclosed in sealed manner inside an insulating casing or a casing body 150 except for the terminals. The outside shape of the casing body 150 is indicated with a single-dot dash line in FIG. 15. The structure including the casing body 150, the cathode wiring 504, the anode wiring 503 and the semiconductor chip 5 is mounted to a multiple-layer printed board 151 formed on a metal substrate 1. The multiple-layer printed board 151 preferably has an anode wiring 152 connected to a portion of the anode wiring 503 (the first sheet-like wiring) that is exposed from the casing body 150, and a cathode wiring 153 connected to a portion of the cathode wiring 504 (the second sheet-like wiring) that is exposed from the casing body 150. The anode wiring 152 and the cathode wiring 153 preferably constitute a third sheet-shaped wiring and a fourth sheet-shaped wiring, respectively.

As seen in FIG. 15, the anode wiring 152 and the cathode wiring 153 formed on the multiple-layer printed board 151 are preferably arranged such that the cathode wiring 153 has a larger width than the anode wiring 152 in accordance with the cathode wiring 504 and the anode wiring 503 connected to the semiconductor chip 5. Moreover, the edges of the cathode wiring 153 preferably protrudes beyond the corresponding edges of the anode wiring 152 by an amount d1 that is at least one half of a distance T1 from the edges of the cathode wiring 153 to the metal substrate 1.

Accordingly, by wiring the semiconductor chip 5 as explained above, the portability of the semiconductor device wiring structure is increased. Moreover, the semiconductor chip 5 is easily replaced when the semiconductor chip 5 fails.

Seventh Embodiment

Referring now to FIGS. 17–20, a semiconductor device wiring structure in accordance with a second embodiment will now be explained. In view of the similarity between the third, sixth and seventh embodiments, the parts of the seventh embodiment that are identical to the parts of the third or sixth embodiment will be given the same reference numerals as the parts of the third or sixth embodiment. Moreover, the descriptions of the parts of the seventh embodiment that are identical to the parts of the third or sixth embodiment may be omitted for the sake of brevity.

Figure 17:
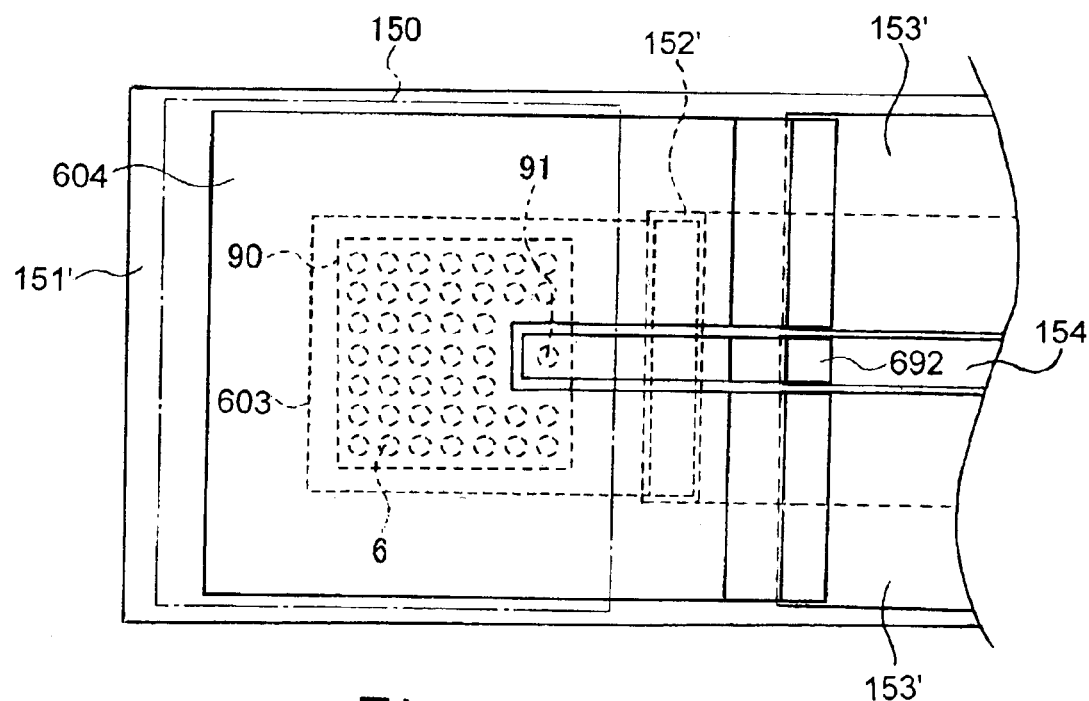
FIG. 17 is a top plan view of a semiconductor device wiring structure in accordance with a seventh embodiment of the present invention.

Similarly to FIG. 15, FIG. 17 is a top plan see-through view of the semiconductor device wiring structure in accordance with the seventh embodiment of the present invention. The seventh embodiment shown in FIG. 17 is basically identical to the sixth embodiment shown in FIGS. 15 and 16, except that the three-terminal semiconductor chip 90, such as a transistor, is used, and a cathode wiring 604 is arranged to accommodate a control signal wiring 692 that is connected to the control signal electrode 91 of the semiconductor chip 90. The arrangement of the control signal wiring 692 in the three-terminal device of FIG. 17 is similar to that of the semiconductor device wiring structure shown in FIG. 10 in the third embodiment. Moreover, in the seventh embodiment of the present invention, a multi-layer printed board 151' includes a control signal connection wiring or control signal wiring 154 to which the control signal wiring 692 is connected. The control signal wiring 154 preferably constitute a control signal connection wiring. A cathode wiring 153' formed in the multi-layer printed board 151' preferably includes a cut away portion within which the control signal wiring 154 is disposed as seen in FIG. 17.

Figure 18:
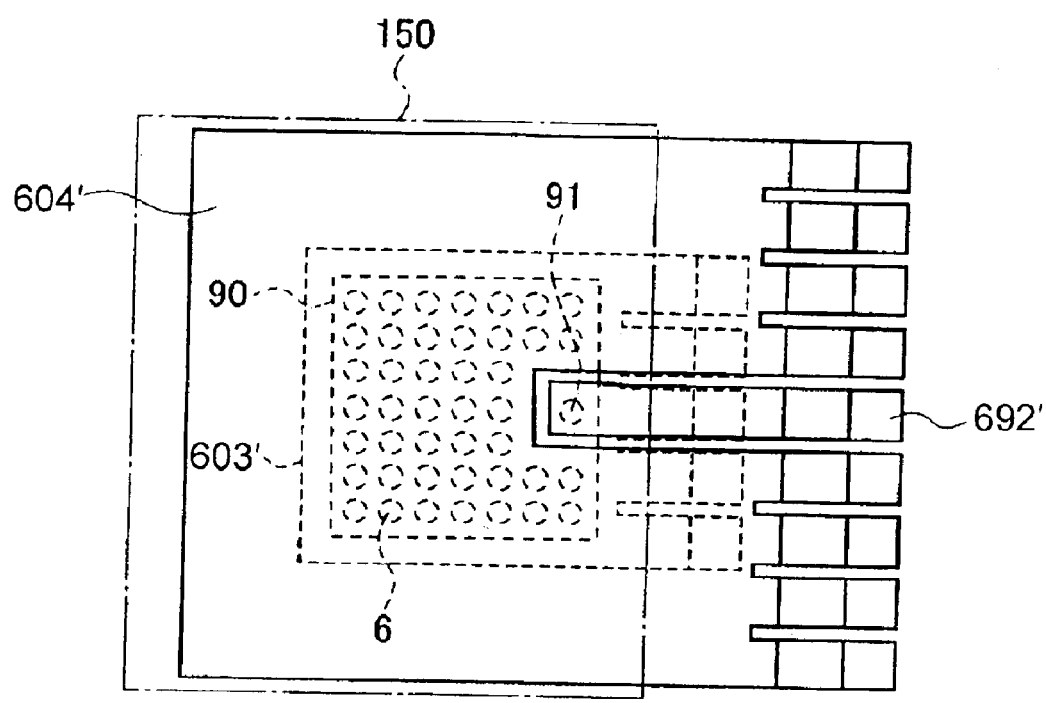
FIG. 18 is a top plan view of a semiconductor device wiring structure in accordance with an alternative of the seventh embodiment of the present invention.

FIG. 18 is a top plan see-through view of an alternative structure of the semiconductor device wiring structure in accordance with the seventh embodiment of the present invention and, similarly to FIG. 17. In comparison with the embodiment shown in FIG. 17, the alternative structure of the seventh embodiment shown in FIG. 18 is distinctive in that a relatively wide wiring terminal of an anode wiring 603' and a cathode wiring 604' formed on the outside of the structure are divided into a plurality of terminals. Accordingly, in the alternative structure of the seventh embodiment, the concentration of stress at solder joints caused by temperature changes is relieved. The dimensional relationship between the distance of the gaps between the individual branched terminals and the interfering electromagnetic wave suppressing effect is in accordance with the previously discussed FIG. 12.

Figure 19:
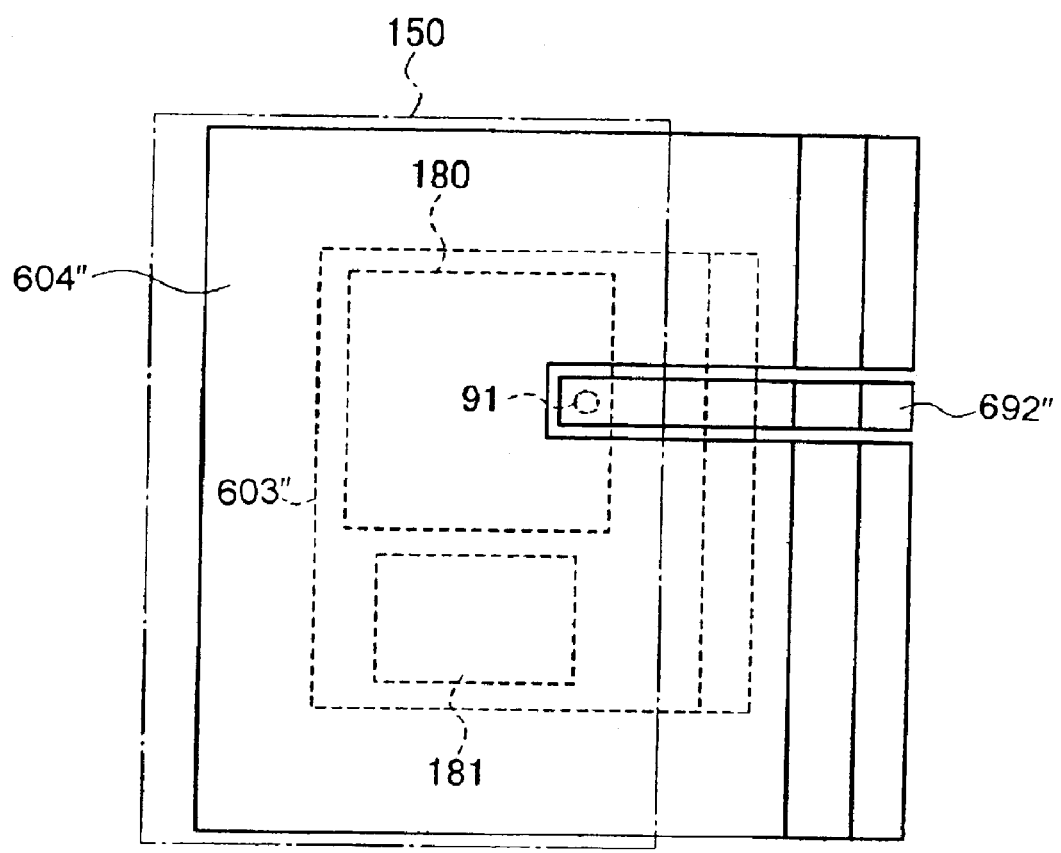
FIG. 19 is a top plan view of a semiconductor device wiring structure in accordance with an alternative of the seventh embodiment of the present invention.
Figure 20:
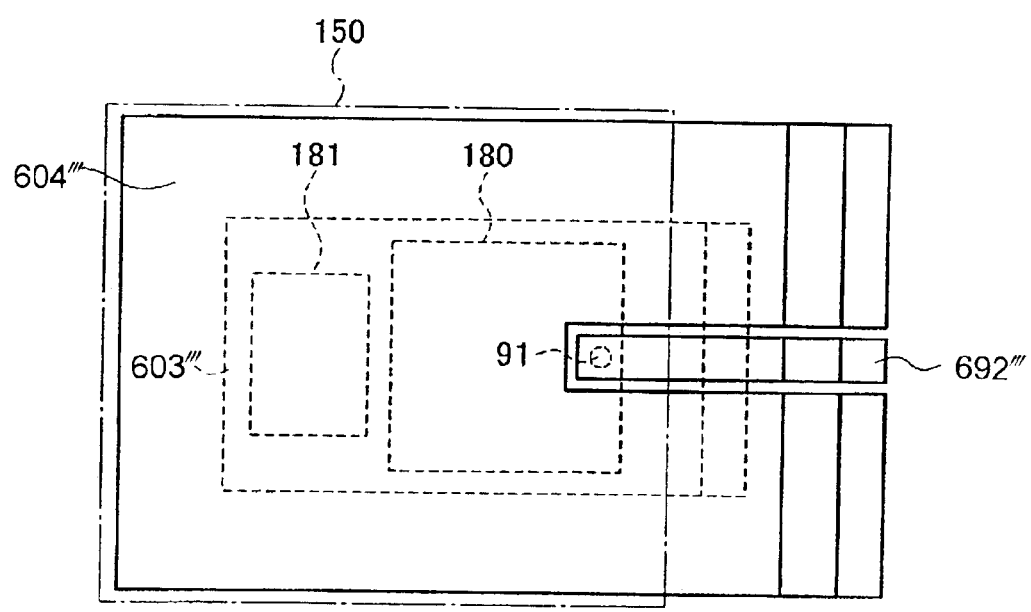
FIG. 20 is a top plan view of a semiconductor device wiring structure in accordance with an alternative of the seventh of the present invention.

Moreover, FIG. 19 is a top plan see-through view of another alternative structure of the semiconductor device wiring structure in accordance with the seventh embodiment of the present invention and is of the wiring structure. Furthermore, FIG. 20 is a top plan see-through view of an additional alternative structure of the semiconductor device wiring structure in accordance with the seventh embodiment of the present invention. These alternative structures shown in FIGS. 19 and 20 are examples of packages in which a semiconductor chip 181 constituting a two-terminal device, such as a diode, and a semiconductor chip 180 constituting a three-terminal device, such as a transistor, are mounted on the semiconductor device wiring structure in parallel. In this way, a plurality of semiconductor chips having different functions can be integrated into a single package, thereby saving storage space.

Eight Embodiment

Figure 21:
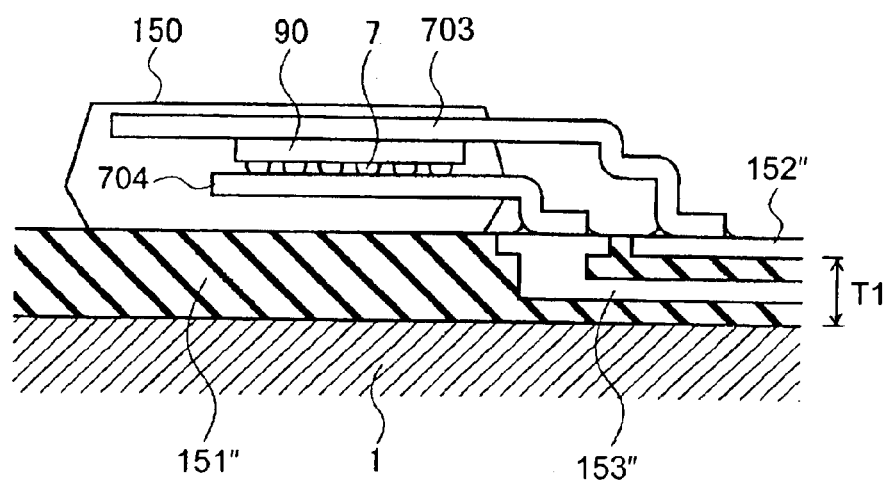
FIG. 21 is a simplified diagrammatic cross sectional view of a semiconductor device wiring structure in accordance with an eighth embodiment of the present invention taken along a section line 21—21 in FIG. 22.
Figure 22:
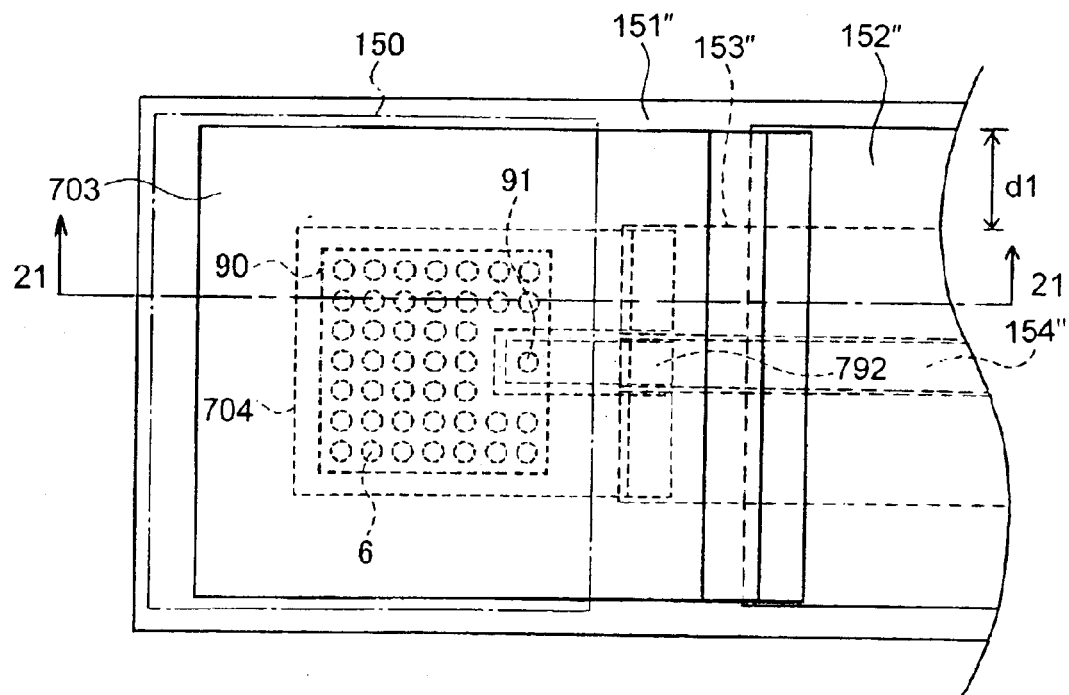
FIG. 22 is a top plan view of the semiconductor device wiring structure illustrated in FIG. 21 in accordance with the eighth embodiment of the present invention.

Referring now to FIGS. 21 and 22, a semiconductor device wiring structure in accordance with an eighth embodiment will now be explained. In view of the similarity between the fifth, seventh and eighth embodiments, the parts of the eighth embodiment that are identical to the parts of the fifth or seventh embodiment will be given the same reference numerals as the parts of the fifth or seventh embodiment. Moreover, the descriptions of the parts of the eighth embodiment that are identical to the parts of the fifth or seventh embodiment may be omitted for the sake of brevity.

FIG. 21 shows a simplified diagrammatic cross sectional view of the semiconductor device wiring structure in accordance with the eighth embodiment of the present invention taken along a section line 21—21 in FIG. 22. FIG. 22 is a top plan see-through view of the semiconductor device wiring structure of the eighth embodiment shown in FIG. 21. The eighth embodiment shown in FIGS. 20 and 21 differs from the seventh embodiment in that the previously mentioned face down bonding method in the fifth embodiment is applied to the semiconductor device wiring structure of the seventh embodiment. In other words, the face down bonding can be utilized to the semiconductor chip 90 constituting a three-terminal device as seen in FIGS. 20 and 21. Thus, in the eighth embodiment of the present invention, a cathode wiring 704 is disposed between an anode wiring 703 and a multiple-layer printed board 151", and the semiconductor chip 90 is disposed between the cathode wiring 704 and the anode wiring 703 in a face down manner. Accordingly, in the eighth embodiment, the cathode wiring 704 and the anode wiring 703 preferably constitute first and second sheet-shaped wirings, respectively.

More specifically, in the eighth embodiment of the present invention, a portion of the cathode wiring 704 that is exposed from the casing body 150 is preferably connected to a cathode wiring 153" (a third sheet-shaped wiring) formed in a multiple-layer printed board 151" formed on the metal substrate 1. A portion of the anode wiring 703 that is exposed from the casing body 150 is preferably connected to an anode wiring 152" (a fourth sheet shaped wiring) formed in the multiple-layer printed board 151" as shown in FIG. 21. As seen in FIG. 22, the anode wiring 703 includes edges that protrude beyond corresponding edges of the cathode wiring 704 and the semiconductor chip 90. Moreover, as explained in FIG. 14(b) of the fifth embodiment, the anode wiring 703 and the cathode wiring 704 are preferably arranged such that the edges of the anode wiring 703 protruding beyond the corresponding edges of the cathode wiring 704 by an amount that is at least one half of a distance from the edges of the anode wiring 703 to the metal substrate 1. Moreover, as seen in FIGS. 22 and 23, the edges of the anode wiring 152" preferably protrude beyond the corresponding edges of the cathode wiring 153" by an amount d1 that is at least one half of a distance T1 from the edges of the anode wiring 152" to the metal substrate 1.

Moreover, as seen in FIG. 22, a control signal wiring 792 is preferably connected to the control signal electrode 91 of the semiconductor chip 90. As in the fifth embodiment of the present invention, the semiconductor chip 90 is disposed such that the cathode electrode 6 and the control signal electrode 91 are disposed on the bottom surface (first main surface) of the semiconductor chip 90. Thus, the control signal wiring 792 is preferably disposed within a cut away portion formed in the cathode wiring 704 as seen in FIG. 22. Moreover, the multi-layer printed board 151" is provided with a control signal connection wiring or control signal wiring 154" that is connected to a portion of the control signal wiring 792 that is exposed from the casing body 150. The control signal wiring 154" is preferably disposed within a cut away portion formed in the cathode wiring 153" as seen in FIG. 22.

Ninth Embodiment

Figure 23:
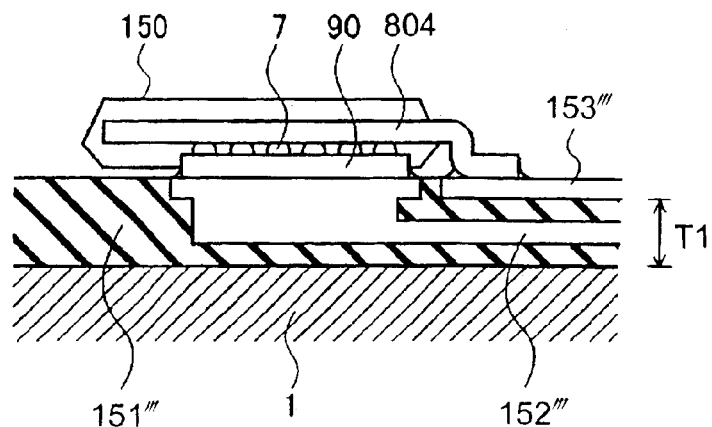
FIG. 23 is a simplified diagrammatic cross sectional view of a semiconductor device wiring structure in accordance with a ninth embodiment of the present invention taken along a section line 23—23 in FIG. 24.
Figure 24:
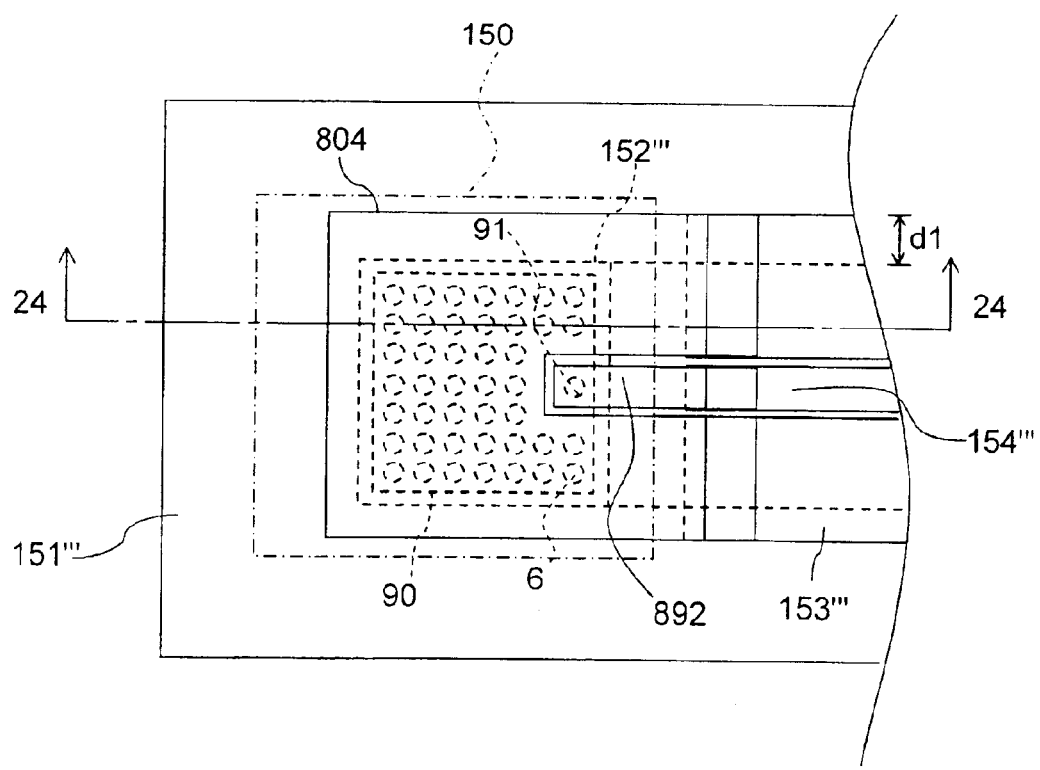
FIG. 24 is a top plan view of the semiconductor device wiring structure illustrated in FIG. 23 in accordance with the ninth embodiment of the present invention.

Referring now to FIGS. 23 and 24, a semiconductor device wiring structure in accordance with a ninth embodiment will now be explained. In view of the similarity between the sixth and ninth embodiments, the parts of the ninth embodiment that are identical to the parts of the sixth embodiment will be given the same reference numerals as the parts of the sixth embodiment. Moreover, the descriptions of the parts of the ninth embodiment that are identical to the parts of the sixth embodiment may be omitted for the sake of brevity.

FIG. 24 is a top plan see-through view of the mounting structure and FIG. 23 is a cross sectional view of the wiring structure as taken along a section line 23—23 in FIG. 24. The ninth embodiment shown in FIGS. 23 and 24 differs from the sixth embodiment shown in FIG. 16 in that the anode wiring 503 inside the casing body 150 is eliminated and an anode electrode provided on the back surface of the semiconductor chip 90 is exposed on the bottom of the package. The exposed anode electrode of the semiconductor chip 90 is connected directly to an anode wiring 152'" formed on the multiple-layer printed board 151'". Otherwise, the semiconductor device wiring structure of the ninth embodiment is substantially the same as the semiconductor device wiring structure of the sixth embodiment shown in FIG. 16. Thus, in the ninth embodiment of the present invention, a cathode wiring 804 and the anode wiring 152'" are arranged such that the edges of the cathode wiring 804 protrude beyond the corresponding edges of the anode wiring 152'" by an amount d1 that is at least one half of a distance T1 from the edges of the cathode wiring 804 to the metal substrate 1. Accordingly, in the ninth embodiment, the anode wiring 152'" preferably constitute a first sheet-shaped wiring and the cathode wiring 804 preferably constitute a second sheet-shaped wiring.

Moreover, as seen in FIG. 24, the multi-layer printed board 151'" is provided with a sheet-shaped connection wiring or cathode wiring 153'" that is connected to a portion of the cathode wiring 804 exposed from the casing body 150. The cathode wiring 153'" is preferably arranged such that edges of the cathode wiring 153'" protrude beyond the corresponding edges of the anode wiring 152'" by an amount at least one half of a distance from the edges of the cathode wiring 153'" to the metal substrate 1. Moreover, in the ninth embodiment of the present invention, a control signal wiring 892 disposed within a cut away portion formed in the cathode wiring 804 is connected to the control signal electrode 91 of the semiconductor ship 90. Furthermore, the multi-layer printed board 151'" is provided with a control signal connection wiring or a control signal wiring 154'" that is connected to a portion of the control signal wiring 892 exposed from the casing body 150. The control signal wiring 154'" is preferably disposed within a cut away portion formed in the cathode wiring 153'" as seen in FIG. 24. Moreover, as seen in FIG. 23, the casing body 150 is arranged to cover a portion of the cathode wiring 804 and the semiconductor chip 90 except for the anode electrode of the semiconductor chip 90.

In the semiconductor device wiring structure of the ninth embodiment, a distance from the cathode wiring 804 to the metal substrate 1 is shorter than in the semiconductor device wiring structure of the sixth embodiment shown in FIG. 16. Therefore, the dimension of the protrusion of the cathode wiring 804 from the package is smaller. As a result, the package can be made more compact. Moreover, the effect of suppressing interfering electromagnetic waves can be increased. Additionally, although the ninth embodiment shown in FIGS. 23 and 24 is applied to the three-terminal semiconductor chip 90, it will be apparent to those skilled in the art from this disclosure that the semiconductor device wiring structure of the ninth embodiment can also be applied in a similar manner to the two-terminal semiconductor chip 5 as in the sixth embodiment shown in FIG. 16.

Tenth Embodiment

Figure 25:
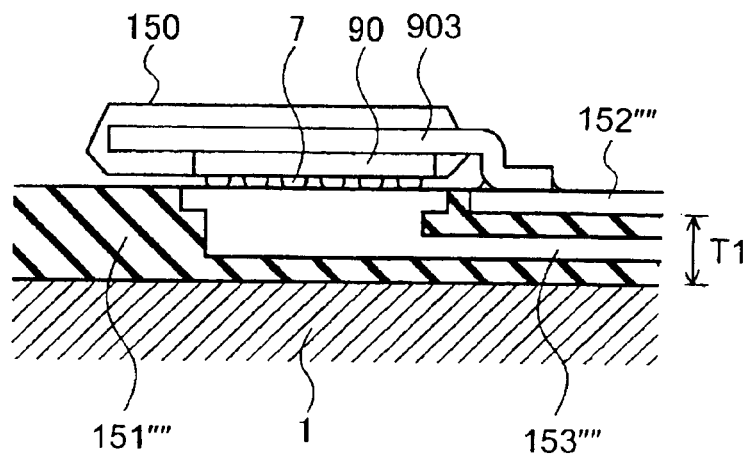
FIG. 25 is a simplified diagrammatic cross sectional view of a semiconductor device wiring structure in accordance with a tenth embodiment of the present invention taken along a section line 25—25 in FIG. 26.
Figure 26:
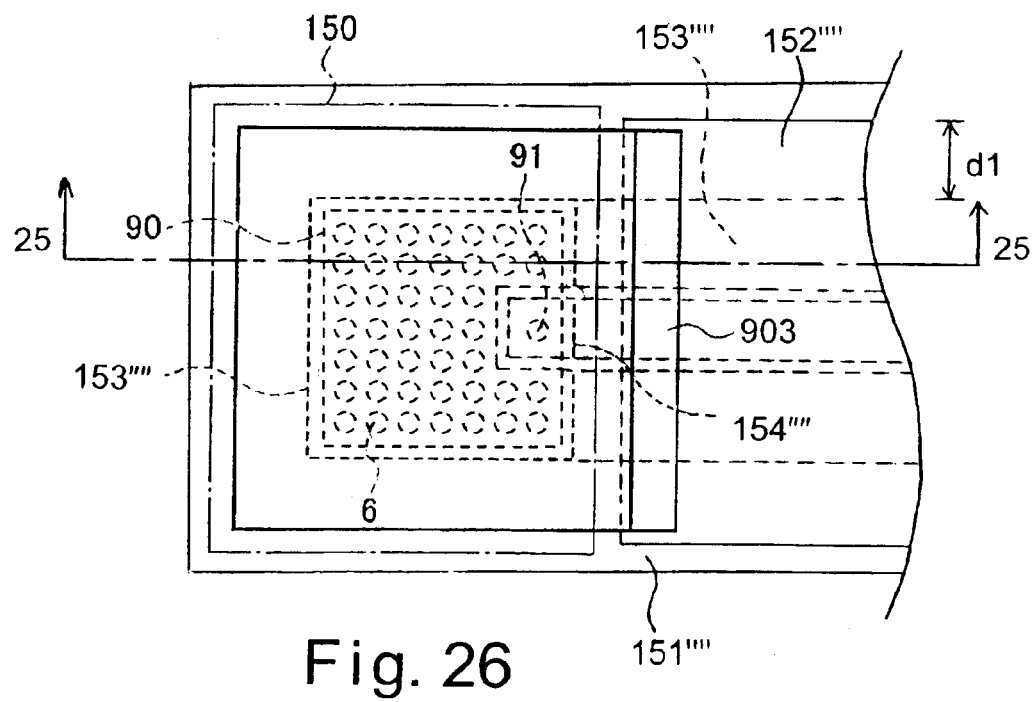
FIG. 26 is a top plan view of the semiconductor device wiring structure illustrated in FIG. 25 in accordance with the tenth embodiment of the present invention.

Referring now to FIGS. 25 and 26, a semiconductor device wiring structure in accordance with a tenth embodiment will now be explained. In view of the similarity between the eight, ninth and tenth embodiments, the parts of the tenth embodiment that are identical to the parts of the eighth or ninth embodiment will be given the same reference numerals as the parts of the eighth or ninth embodiment. Moreover, the descriptions of the parts of the tenth embodiment that are identical to the parts of the eighth or ninth embodiment may be omitted for the sake of brevity.

FIG. 25 is a cross sectional view of the semiconductor device wiring structure in accordance with the tenth embodiment of the invention as taken along a section line 25—25 in FIG. 26. FIG. 26 is a top plan see-through view of the semiconductor device wiring structure shown in FIG. 25. The tenth embodiment shown in FIGS. 24 and 25 is an example of a case in which the previously mentioned face down bonding method is applied to the ninth embodiment shown in FIGS. 23 and 24. In other words, the face down bonding can be applied to the semiconductor chip 90 shown in FIGS. 23 and 24 as shown in FIGS. 25 and 26. More specifically, the ninth embodiment shown in FIGS. 25 and 26 differs from the eighth embodiment shown in FIG. 21 in that the cathode wiring 704 inside the package is eliminated and the solder bumps 7 provided on the bottom surface of the semiconductor chip 90 are connected directly to the cathode wiring 153"" formed on the multiple-layer printed board 151"". Thus, in the tenth embodiment of the present invention, the anode wiring 903 preferably constitutes a second sheet-shaped wiring and the cathode wiring 153"" preferably constitutes a first sheet-shaped wiring. As seen in FIG. 25, a portion of the anode wiring 903 that is exposed from the casing body 150 is connected to a sheet-shaped connection wiring or anode wiring 152"" formed in the multi-layer printed board 151"".

Moreover, the multi-layer printed board 151"" is provided with a control signal wiring 154"" that is connected to the control signal electrode 91 of the semiconductor chip 90. As seen in FIG. 26, the control signal wiring 154"" is preferably disposed within a cut away portion formed in the cathode wiring 153"" of the multi-layer printed board 151"". As seen in FIG. 25, the casing body 150 is arranged to cover a portion of the anode wiring 903 and the semiconductor chip 90 except for the cathode electrode 6 and the control signal electrode 91. The edges of the anode wiring 152"" preferably protrude beyond the corresponding edges of the cathode wiring 153"" by an amount d1 that is at least one half of a distance T1 from the edges of the anode wiring 152"" to the metal substrate 1.

As used herein, the following directional terms "above, downward, vertical, horizontal, below and transverse" as well as any other similar directional terms refer to those directions of a semiconductor device wiring structure of the present invention. Accordingly, these terms, as utilized to describe the present invention should be interpreted relative to a main surface of the semiconductor device used in the semiconductor device wiring structure of the present invention.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2003-272485. The entire disclosure of Japanese Patent Application No. 2003-272485 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A semiconductor device wiring structure comprising:
    a semiconductor device having a first electrode on a first main surface and a second electrode on a second main surface that faces in an opposite direction as the first main surface;
    a first sheet-shaped wiring conductively connected to the first electrode of the semiconductor device;
    a second sheet-shaped wiring conductively connected to the second electrode of the semiconductor device, the second sheet-shaped wiring being disposed with respect to the first sheet-shaped wiring such that a current direction in the second sheet-shaped wiring is opposite to a current direction in the first sheet-shaped wiring; and
    a conductive substrate having a base surface with a larger width than the second sheet-shaped wiring, the conductive substrate being arranged adjacent to the first sheet-shaped wiring such that the base surface of the conductive substrate is disposed substantially parallel to the first main surface of the semiconductor device,
    the second sheet-shaped wiring including edges that protrude beyond corresponding edges of both of the first sheet-shaped wiring and the semiconductor device in all locations such that the second sheet-shaped wiring substantially covers the first sheet-shaped wiring and the semiconductor device in a top plan view, the edges of the second sheet-shaped wiring protruding beyond the corresponding edges of at least one of the first sheet-shaped wiring and the semiconductor device by an amount that is at least one half of a distance from the edges of the second sheet-shaped wiring to the conductive substrate.

2. The semiconductor device wiring structure as recited in claim 1, further comprising
    a sheet-shaped control signal wiring conductively connected to a control signal electrode provided on the first main surface of the semiconductor device, the sheet-shaped control signal wiring being disposed within a cut away portion formed in the first sheet-shaped wiring.

3. The semiconductor device wiring structure as recited in claim 1, wherein
    a sheet-shaped control signal wiring conductively connected to a control signal electrode provided on the second main surface of the semiconductor device, the sheet-shaped control signal wiring being disposed within a cut away portion formed in the second sheet-shaped wiring.

4. The semiconductor device wiring structure as recited in claim 3 wherein the second sheet-shaped wiring includes a first terminal point that is located farthest from the first sheet-shaped wiring on a surface of the second sheet-shaped wiring that faces the sheet-shaped control signal wiring, and the sheet-shaped control signal wiring includes a second terminal point that is located farthest from the first sheet-shaped wiring on a surface of the sheet-shaped control signal wiring that faces the second sheet-shaped wiring, the first and second terminal points being spaced by a distance that is equal to or smaller than four times a distance from at least one of the first and second terminal points to the first sheet-shaped wiring in a plane perpendicular to the direction of the electric current flow in the second sheet-shaped wiring.

5. The semiconductor device wiring structure as recited in claim 3, wherein the second sheet-shaped wiring and the sheet-shaped control signal wiring include a plurality of brim portions where the second sheet-shaped wiring and the sheet-shaped control signal wiring face each other to increase a distance between a terminal point of the second sheet-shaped wiring that is located farthest from the first sheet-shaped wiring on a surface of the second sheet-shaped wiring that faces the sheet-shaped control signal wiring and a terminal point of the sheet-shaped control signal wiring that is located farthest from the first sheet-shaped wiring on a surface of the sheet-shaped control signal wiring that faces the second sheet-shaped wiring in a plane perpendicular to the direction of the electric current flow in the second sheet-shaped wiring.

6. A semiconductor device wiring structure comprising:

a semiconductor device having a first electrode on a first main surface and a second electrode on a second main surface that faces in an opposite direction as the first main surface;

a first sheet-shaped wiring conductively connected to the first electrode of the semiconductor device;

a second sheet-shaped wiring conductively connected to the second electrode of the semiconductor device;

an insulating casing configured and arranged to cover the semiconductor device and portions of the first and second sheet-shaped wirings;

a third sheet-shaped wiring conductively connected to a portion of the first sheet-shaped wiring that is exposed from the insulating casing;

a fourth sheet-shaped wiring conductively connected to a portion of the second sheet-shaped wiring that is exposed from the insulating casing, the fourth sheet-shaped wiring being disposed with respect to the third sheet-shaped wiring such that a current direction in the fourth sheet-shaped wiring is opposite to a current direction in the third sheet-shaped wiring; and a conductive substrate having a base surface with a larger width than the second sheet-shaped wiring and the fourth sheet-shaped wiring, the conductive substrate being arranged adjacent to the first sheet-shaped wiring and the third sheet-shaped wiring such that the base surface of the conductive substrate is disposed substantially parallel to the first main surface of the semiconductor device, the second sheet-shaped wiring and the fourth sheet-shaped wiring including edges that protrude beyond corresponding edges of the first sheet-shaped wiring, the third sheet-shaped wiring and the semiconductor device in all locations such that the first sheet-shaped wiring, the third sheet-shaped wiring and the semiconductor device being substantially covered with the second sheet-shaped wiring and the fourth sheet-shaped wiring in a top plan view, the edges of the second sheet-shaped wiring protruding beyond the corresponding edges of at least one of the first sheet-shaped wiring and the semiconductor device by an amount that is at least one half of a distance from the edges of the second sheet-shaped wiring to the conductive substrate, the edges of the fourth sheet-shaped wiring protruding beyond the corresponding edges of the third sheet-shaped wiring by an amount that is at least one half of a distance from the edges of the fourth sheet-shaped wiring to the conductive substrate.

7. The semiconductor device wiring structure as recited in claim 6, further comprising a sheet-shaped control signal wiring conductively connected to a control signal electrode provided on the first main surface of the semiconductor device, a portion of the sheet-shaped control signal wiring being covered by the insulating casing, the sheet-shaped control signal wiring being disposed within a cut away portion formed in the first sheet-shaped wiring; and a sheet-shaped control signal connection wiring conductively connected to a portion of the sheet-shaped control signal wiring that is exposed from the insulating casing, the sheet-shaped control signal connection wiring being disposed within a cut away portion formed in the third sheet-shaped wiring.

8. The semiconductor device wiring structure as recited in claim 6, further comprising a sheet-shaped control signal wiring conductively connected to a control signal electrode provided on the second main surface of the semiconductor device, a portion of the sheet-shaped control signal wiring being covered by the insulating casing, the sheet-shaped control signal wiring being disposed within a cut away portion formed in the second sheet-shaped wiring; and a sheet-shaped control signal connection wiring conductively connected to a portion of the sheet-shaped control signal wiring that is exposed from the insulating casing, the sheet-shaped control signal connection wiring being disposed within a cut away portion formed in the fourth sheet-shaped wiring.

9. A semiconductor device wiring structure comprising:

a semiconductor device having a first electrode on a first main surface and a second electrode on a second main surface that faces in an opposite direction as the first main surface;

a first sheet-shaped wiring conductively connected to the first electrode of the semiconductor device;

a second sheet-shaped wiring conductively connected to the second electrode of the semiconductor device;

a sheet-shaped connection wiring conductively connected to the second sheet-shaped wiring, the sheet-shaped connection wiring being disposed with respect to the first sheet-shaped wiring such that a current direction in the sheet-shaped connection wiring is opposite to a current direction in the first sheet-shaped wiring;

a conductive substrate having a base surface with a larger width than the second sheet-shaped wiring and the sheet-shaped connection wiring, the conductive substrate being arranged adjacent to the first sheet-shaped wiring such that the base surface of the conductive substrate is disposed substantially parallel to the first main surface of the semiconductor device, the second sheet-shaped wiring and the sheet-shaped connection wiring including edges that protrude beyond corresponding edges of the first sheet-shaped wiring and the semiconductor device in all locations such that the first sheet-shaped wiring and the semiconductor device being substantially covered with the second sheet-shaped wiring and the sheet-shaped connection wiring in a top plan view, the edges of the second sheet-shaped wiring protruding beyond the corresponding edges of at least one of the first sheet-shaped wiring and the semiconductor device by an amount that is at least one half of a distance from the edges of the second sheet-shaped wiring to the conductive substrate, the edges of the sheet-shaped connection wiring protruding beyond the corresponding edges of at least one of the first sheet-shaped wiring and the semiconductor device by an amount that is at least one half of a distance from the edges of the sheet-shaped connection wiring to the conductive substrate.

10. The semiconductor device wiring structure as recited in claim 9, further comprising a sheet-shaped control signal wiring conductively connected to a control signal electrode provided on the first main surface of the semiconductor device, the sheet-shaped control signal wiring being disposed within a cut away portion formed in the first sheet-shaped wiring.

11. The semiconductor device wiring structure as described in claim 9, further comprising an insulating casing configured and arranged to cover a portion of the second sheet-shaped wiring and the semiconductor device, except for the first electrode.

12. The semiconductor device wiring structure as recited in claim 9, further comprising a sheet-shaped control signal wiring conductively connected to a control signal electrode provided on the second main surface of the semiconductor device, the sheet-shaped control signal wiring being disposed within a cut away portion formed in the second sheet-shaped wiring;

a sheet-shaped control signal connection wiring conductively connected to the sheet-shaped control signal wiring, the sheet-shaped control signal connection wiring being disposed within a cut away portion formed in the sheet-shaped connection wiring.

13. The semiconductor device wiring structure as recited in claim 12, further comprising an insulating casing configured and arranged to cover a portion of the second sheet-shaped wiring, a portion of the sheet-shaped control signal wiring, and the semiconductor device, except for the first electrode.

14. A semiconductor device wiring structure comprising:

a semiconductor device having a first electrode on a first main surface and a second electrode on a second main surface that faces in an opposite direction as the first main surface;

first electrical conductive means for conducting electrical current, the first electrical conductive means being conductively connected to the first electrode of the semiconductor device;

second electrical conductive means for conducting electrical current, the second electrical conductive means being conductively connected to the second electrode of the semiconductor device, and arranged relative to the first electrical conductive means such that a current direction in the second electrical conductive means is opposite to a current direction in the first electrical conductive means; and substrate means for forming a conductive layer having a base surface with a larger width than the second electrical conductive means, the substrate means being arranged adjacent to the first electrical conductive means such that the base surface of the substrate means is disposed substantially parallel to the first main surface of the semiconductor device, the second electrical conductive means overlying the first electrical conductive means such that edges of the second electrical conductive means protrude beyond corresponding edges of both of the first electrical conductive means and the semiconductor device in all locations such that the second electrical conductive means substantially covers the first electrical conductive means and the semiconductor device in a top plan view, the edges of the second electrical conductive means protruding beyond the corresponding edges of at least one of the first electrical conductive means and the semiconductor device by an amount that is at least one half of a distance from the edges of the second electrical conductive means to the substrate means.

* * * * *